(12) United States Patent
Takeya et al.

(10) Patent No.: US 6,870,193 B2
(45) Date of Patent: Mar. 22, 2005

(54) SEMICONDUCTOR LIGHT EMITTING DEVICE AND ITS MANUFACTURING METHOD

(75) Inventors: Motonobu Takeya, Miyagi (JP); Takeharu Asano, Miyagi (JP); Masao Ikeda, Miyagi (JP)

(73) Assignee: Sony Corporation, Tokyo (JP)

(*) Notice: Subject to any disclaimer, the term of this patent is extended or adjusted under 35 U.S.C. 154(b) by 21 days.

(21) Appl. No.: 10/349,609

(22) Filed: Jan. 23, 2003

(65) Prior Publication Data

US 2003/0136970 A1 Jul. 24, 2003

(30) Foreign Application Priority Data

Jan. 24, 2002 (JP) .................................... P2002-016084
Sep. 6, 2002 (JP) .................................... P2002-261410

(51) Int. Cl.[7] ............................................. H01L 27/15
(52) U.S. Cl. ........................... 257/79; 257/86; 257/87; 257/94; 257/99; 257/103
(58) Field of Search ................................. 257/79–103

(56) References Cited

U.S. PATENT DOCUMENTS 5,594,750 A * 1/1997 Zhang et al. ................. 372/45
5,959,307 A   9/1999 Nakamura et al.
6,542,528 B1 * 4/2003 Sato et al. .................... 372/45

FOREIGN PATENT DOCUMENTS

JP        9-219556         8/1997

* cited by examiner

Primary Examiner—Long Pham
Assistant Examiner—Wai-Sing Louie
(74) Attorney, Agent, or Firm—Sonnenschein, Nath & Rosenthal LLP

(57) ABSTRACT

In a semiconductor light emitting device such as a semiconductor laser using nitride III-V compound semiconductors and having a structure interposing an active layer between an n-side cladding layer and a p-side cladding layer, the p-side cladding layer is made of an undoped or n-type first layer 9 and a p-type second layer 12 that are deposited sequentially from nearer to remoter from the active layer. The first layer 9 is not thinner than 50 nm. The p-type second layer 12 includes a p-type third layer having a larger band gap inserted therein as an electron blocking layer. Thus the semiconductor light emitting device is reduced in operation voltage while keeping a thickness of the p-side cladding layer necessary for ensuring favorable optical properties.

17 Claims, 13 Drawing Sheets

THICKNESS OF THE UNDOPED LAYER OF THE p-SIDE CLADDING LAYER (nm)

THICKNESS OF THE UNDOPED LAYER OF THE p-SIDE CLADDING LAYER (nm)

SEMICONDUCTOR LIGHT EMITTING DEVICE AND ITS MANUFACTURING METHOD

BACKGROUND OF THE INVENTION

1. Field of the Invention

This invention relates to a semiconductor light emitting device and its manufacturing method especially suitable for application to semiconductor lasers and light emitting diodes using nitride-family III-V compound semiconductors.

2. Description of the Related Art

In recent years, semiconductor lasers using nitride-family III-V compound semiconductors such as AlGaInN and others have been a subject of vigorous researches and developments as semiconductor lasers capable of emitting light from the blue region to the ultraviolet region required for enhancing the density of optical discs, and some have already been brought into practical use.

Semiconductor lasers having been reported heretofore include an electron-blocking layer (also called a cap layer) made of p-type AlGaN on an active layer nearer to a p-type cladding layer (for example, Japanese Patent Laid-Open Publication No. hei 9-219556). FIG. 15 shows energy bands, especially the conduction band, of a conventional semiconductor laser using the p-type AlGaN electron-blocking layer. In FIG. 15, $E_c$ indicates the bottom energy in the conduction band. In this semiconductor laser, the p-type AlGaN electron-blocking layer is considered to restrict overflow of electrons and prevent separation of In from the active layer even during operation under a high temperature and a high current.

In the conventional semiconductor laser, however, while the p-type AlGaN cladding layer usually has a thickness around 0.5 to 0.6 µm and an Al composition ratio around 0.06, the specific resistance of the p-type AlGaN cladding layer is as high as 3 to 4 Ωcm. Therefore, a large voltage drop occurs during operation due to the resistance of the p-type AlGaN cladding layer, and it is difficult to control the operation voltage not to exceed 5 V. If the p-type cladding layer is reduced in thickness, the operation voltage will certainly decrease. However, this is not an effective countermeasure because of insufficient confinement of light, failure to obtain favorable FFP (far field pattern), and other problems. Additionally, since the p-type layer contains a large quantity of Mg as the p-type impurity and therefore exhibits high absorption coefficient to light, the p-type layer existing near the active layer increases the internal absorption loss and degrades the laser property.

It is therefore an object of the invention to provide a semiconductor light emitting device reduced in operation voltage and having a favorable property by appropriate design of the distance between the active layer and the p-type layer while maintaining a thickness of the p-side cladding layer necessary and sufficient for obtaining a favorable optical property, and to provide a method capable of easily manufacturing such a semiconductor light emitting device.

OBJECTS AND SUMMARY OF THE INVENTION

This and other objects of the invention will appear more clearly from the description made below with reference to the accompanying drawings.

According to the first aspect of the invention, there is provided a semiconductor light emitting device made by using nitride III-V compound semiconductors, which has a structure interposing an active layer between an n-side cladding layer and a p-side cladding layer, comprising:

the p-side cladding layer including an undoped or n-type first layer and a p-type second layer doped with a p-type impurity which lie in this order from one side nearer the active layer, and the second layer including a third layer having a larger band gap than the second layer.

This semiconductor light emitting device typically has a SCH structure (separate confinement heterostructure). That is, an n-side optical waveguide layer is interposed between the n-side cladding layer and the active layer, and a p-side optical waveguide layer is interposed between the p-side cladding layer and the active layer.

It is generally sufficient that the entire thickness of the p-side cladding layer is 500~600 nm. Thickness of the p-type second layer of the p-side cladding layer is typically larger than 0 nm and does not exceed 550 nm or 450 nm, but it is typically in the range from 390 to 550 nm, or more typically in the range from 400 to 530 nm. On the other hand, thickness of the undoped first layer of the p-side cladding layer (in this case, it exhibits an n⁻-type, and its specific resistance is usually lower than p-type layers approximately by one of several fragments to one digit) is generally larger than 0 nm and does not exceed 500 nm. However, from the viewpoint of sufficiently reducing the resistance of the p-side cladding layer, it is controlled not to be smaller than 50 nm, preferably not to be smaller than 70 nm or more preferably not to be smaller than 90 nm. On the other hand, it is typically controlled not to exceed 400 nm, 300 nm or 200 nm. Thus the thickness of the first layer may be in a range defined by a desired combination of those upper and lower limits. In one typical example, thickness of this first layer is in the range from 70 to 130 nm, and in a more typical example, it is controlled in the range from 90 to 110 nm. These undoped or n-type first layer and p-type second layer may be made of a common material or different materials provided necessary optical properties such as sufficiently high light confining coefficient Γ and favorable FFP are ensured. In an example of the former configuration, both the first layer and the second layer may be made of AlGaN. In an example of the latter configuration, AlGaN may be used as the material of the second layer whereas AlGaInN, GaN or InGaN may be used as the material of the first layer. The first layer and the second layer may be in direct contact, or may be in indirect contact via another layer having a certain function.

In case an n-side optical waveguide layer and a p-side optical waveguide layer are provided, their thickness is larger than 0 nm and does not exceed 150 nm, in general.

The undoped or n-type first layer of the p-side cladding layer preferably has a superlattice structure from the viewpoint of facilitating holes injected from the part of the p-side electrode during operation of the semiconductor light emitting device and thereby increasing the injection efficiency, and simultaneously introducing a hetero interface to inhibit diffusion of Mg typically uses as the p-type impurity of the second layer to the part of the active layer and thereby prevent deterioration of the active layer. In a typical example, the entirety of the p-side cladding layer is in form of a superlattice structure.

The third layer existing in the p-type second layer is made of a p-type nitride III-V compound semiconductor containing Al and Ga in general. More specifically, it is made of, for example p-type $Al_xGa_{1-x}N$ (where $0<x<1$). From the viewpoint of effectively preventing overflow of electros injected to the active layer, it is preferably made of p-type $Al_xGa_{1-x}N$ (where $0.15 \leq x<1$).

From the viewpoint of preventing deterioration of the active layer due to diffusion of Mg usually used as the p-type impurity of the p-type second layer into the active layer, distance between the active layer and the p-type second layer of the p-side cladding layer is preferably controlled not to be smaller than 20 nm, more preferably not to be smaller than 50 nm, or more preferably not to be smaller than 100 nm. According to a recent report, diffusion distance of holes in GaN is approximately 0.28 μm (280 nm). Taking it into consideration, for the purpose of reducing the probability of recombination with electrons and enhancing the injection efficiency of holes to the active layer, distance between the active layer and the p-type second layer of the p-side cladding layer is preferably controlled not to exceed the diffusion distance.

On the other hand, from the viewpoint of preventing diffusion of the p-type impurity, such as Mg, from the p-type second layer of the p-side cladding layer to the active layer and thereby preventing deterioration of the active layer, at least one combination of layers different in band gap or lattice constant, or at least one layer of superlattice structure composed of layers different in atomic composition ratio, is preferably interposed between the active layer and the p-type second layer of the p-side cladding layer such that it functions as a lattice distortion layer and prevents diffusion of Mg.

The first layer of the p-side cladding layer is made of AlGaN in a typical example. Especially from the viewpoint of improving the characteristic temperature $T_0$ while preventing the threshold current density $J_{th}$ from increasing, it is preferably made of $Al_yGa_{1-y}N$ in which the Al composition ratio is controlled not to exceed 0.04 (where $0<y \leq 0.04$).

Typically, the nitride III-V compound semiconductor forming the barrier layer of the active layer is $In_xGa_{1-x}N$ (where $0<x<1$), and the nitride III-V compound semiconductor forming the well layer of the active layer is $In_yGa_{1-y}N$ (where $0<y<1$ and $y>x$).

A nitride III-V compound semiconductor generally contains at least one kind of group III element selected from the group consisting of Ga, Al, In and B, and one or more group V elements including at least N with or without additional As or P. In other words, a nitride III-V compound semiconductor is generally made of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$ and $0 \leq u+v<1$). More specifically, it is made of $Al_xB_yGa_{1-x-y-z}In_zN$ (where $0 \leq x \leq 1$, $0 \leq y \leq 1$, $0 \leq z \leq 1$ and $0 \leq x+y+z<1$). Typically, it is made of $Al_xGa_{1-x-z}In_zN$ (where $0 \leq x \leq 1$ and $0 \leq z \leq 1$). Examples of nitride III-V compound semiconductors are GaN, InN, AlN, AlGaN, InGaN, AlGaInN, and so on.

According to the second aspect of the invention, there is provided a semiconductor light emitting device made by using nitride III-V compound semiconductors, which has a structure interposing an active layer between an n-side cladding layer and a p-side cladding layer, comprising:

the p-side cladding layer including an undoped or n-type first layer and a p-type second layer doped with a p-type impurity in this order from one side nearer to the active layer, and the first layer having a thickness not thinner than 50 nm.

In the second aspect of the invention, the foregoing explanation made in conjunction with the first aspect of the invention is also applicable to the extent not contradictory to its nature.

According to the third aspect of the invention, there is provided a semiconductor light emitting device having a structure interposing an active layer between an n-side cladding layer and a p-side cladding layer, comprising:

the p-side cladding layer including an undoped or n-type first layer and a p-type second layer doped with a p-type impurity in this order from one side nearer to the active layer, and the first layer having a thickness not thinner than 50 nm.

Basically, the above-summarized semiconductor light emitting device may be made of any semiconductors. In addition to nitride III-V compound semiconductors, various kinds of III-V compound semiconductors such as AlGaAs-family semiconductors, AlGaInP-family semiconductors, InGaAsP-family semiconductors and GaInNAs-family semiconductors, II-VI compound semiconductors such as ZnSe-family semiconductors, and even diamond are also usable.

In the third aspect of the invention, the foregoing explanation made in conjunction with the first aspect of the invention is also applicable to the extent not contradictory to its nature.

According to the fourth aspect of the invention, there is provided a semiconductor light emitting device made by using nitride III-V compound semiconductors, which has a structure interposing an active layer between an n-side cladding layer and a p-side cladding layer and includes a ridge structure, comprising:

the p-side cladding layer including an undoped or n-type first layer and a p-type second layer doped with a p-type impurity in this order from one side nearer to the active layer, and the second layer including a third layer having a larger band gap than the second layer; and p-type layers in opposite sides of the ridge having a thickness in the range from 0 to 100 nm.

According to the fifth aspect of the invention, there is provided a semiconductor light emitting device made by using nitride III-V compound semiconductors, and having a structure interposing an active layer between an n-side cladding layer and a p-side cladding layer and a ridge structure, comprising:

the p-side cladding layer including an undoped or n-type first layer and a p-type second layer doped with a p-type impurity in this order from one side nearer to the active layer, and the second layer including a third layer having a larger band gap than the second layer; and bottom surfaces of portions in opposite sides of the ridge being deeper than the boundary between the first layer and the second layer.

According to the sixth aspect of the invention, there is provided a semiconductor light emitting device made by using nitride III-V compound semiconductors, which has a structure interposing an active layer between an n-side cladding layer and a p-side cladding layer and has a ridge structure, comprising:

the p-side cladding layer including an undoped or n-type first layer and a p-type second layer doped with a p-type impurity in this order from one side nearer to the active layer; and p-type layers in opposite sides of the ridge having a thickness in the range from 0 to 100 nm.

According to the seventh aspect of the invention, there is provided a semiconductor light emitting device made by using nitride III-V compound semiconductors, which has a structure interposing an active layer between an n-side cladding layer and a p-side cladding layer and has a ridge structure, comprising:

the p-side cladding layer including an undoped or n-type first layer and a p-type second layer doped with a p-type impurity in this order from one side nearer to the active layer; and bottom surfaces of portions in opposite sides of the ridge being deeper than the boundary between the first layer and the second layer.

According to the eighth aspect of the invention, there is provided a semiconductor light emitting device having a structure interposing an active layer between an n-side cladding layer and a p-side cladding layer and having a ridge structure, comprising:

the p-side cladding layer including an undoped or n-type first layer and a p-type second layer doped with a p-type impurity in this order from one side nearer to the active layer; and p-type layers in opposite sides of the ridge having a thickness in the range from 0 to 100 nm.

According to the ninth aspect of the invention, there is provided a semiconductor light emitting device having a structure interposing an active layer between an n-side cladding layer and a p-side cladding layer and having a ridge structure, comprising:

the p-side cladding layer including an undoped or n-type first layer and a p-type second layer doped with a p-type impurity in this order from one side nearer to the active layer; and bottom surfaces of portions in opposite sides of the ridge being deeper than the boundary between the first layer and the second layer.

In the fourth, sixth and eighth aspects of the invention, for the purpose of minimizing the thickness of the p-type second layer positioned inside the ridge and thereby more effectively preventing leakage of the injected current outside the ridge, thickness of p-type layers in opposite sides of the ridge is preferably controlled in the range from 0 to 50 nm. That is, even if the activation rate of the p-type impurity such as Mg in the p-type second layer is enhanced and thereby decreases the resistance of the second layer when the operation temperature of the semiconductor light emitting device rises, since most part of the p-type second layer is inside the ridge, quantity of the leak current outside the ridge can be reduced significantly. This contributes especially to improvement of the characteristic temperature $T_0$ of a semiconductor laser.

In the fifth, seventh and ninth aspects of the invention, bottom surfaces of portions in opposite sides of the ridge are typically positioned inside the first layer.

In the fourth through ninth aspects of the invention, the foregoing explanation made in conjunction with the first to third aspects of the invention is also applicable to the extent not contradictory to its nature.

According to the tenth aspect of the invention, there is provided a method of manufacturing a semiconductor light emitting device composed of nitride III-V compound semiconductors to have a structure interposing an active layer between an n-side cladding layer and a p-side cladding layer, the p-side cladding layer including an undoped or n-type first layer and a p-type second layer doped with a p-type impurity which lie in this order from one side nearer the active layer, and the second layer including a third layer having a larger band gap than the second layer, comprising:

growing layers from the active layer to the third layer in a carrier gas atmosphere containing nitrogen as a major component thereof and containing substantially no hydrogen.

According to the eleventh aspect of the invention, there is provided a method of manufacturing a semiconductor light emitting device composed of nitride III-V compound semiconductors to have a structure interposing an active layer between an n-side cladding layer and a p-side cladding layer, the p-side cladding layer including an undoped or n-type first layer and a p-type second layer doped with a p-type impurity which lie in this order from one side nearer the active layer, and the first layer having a thickness not thinner than 50 nm, comprising:

growing layers from the active layer to the first layer of the p-side cladding layer in a carrier gas atmosphere containing nitrogen as a major component thereof and containing substantially no hydrogen.

According to the twelfth aspect of the invention, there is provided a method of manufacturing a semiconductor light emitting device composed of nitride III-V compound semiconductors to have a structure interposing an active layer between an n-side cladding layer and a p-side cladding layer and have a ridge structure, the p-side cladding layer including an undoped or n-type first layer and a p-type second layer doped with a p-type impurity which lie in this order from one side nearer the active layer, the second layer including a third layer having a larger band gap than the second layer, and p-type layers in opposite sides of the ridge having a thickness in the range from 0 to 100 nm, comprising:

growing layers from the active layer to the third layer in a carrier gas atmosphere containing nitrogen as a major component thereof and containing substantially no hydrogen.

According to the thirteenth aspect of the invention, there is provided a method of manufacturing a semiconductor light emitting device composed of nitride III-V compound semiconductors to have a structure interposing an active layer between an n-side cladding layer and a p-side cladding layer and have a ridge structure, the p-side cladding layer including an undoped or n-type first layer and a p-type second layer doped with a p-type impurity which lie in this order from one side nearer the active layer, the second layer including a third layer having a larger band gap than the second layer, and bottom surfaces of portions in opposite sides of the ridge being deeper than the boundary between the first layer and the second layer, comprising:

growing layers from the active layer to the third layer in a carrier gas atmosphere containing nitrogen as a major component thereof and containing substantially no hydrogen.

According to the fourteenth aspect of the invention, there is provided a method of manufacturing a semiconductor light emitting device composed of nitride III-V compound semiconductors to have a structure interposing an active layer between an n-side cladding layer and a p-side cladding layer and have a ridge structure, the p-side cladding layer including an undoped or n-type first layer and a p-type second layer doped with a p-type impurity which lie in this order from one side nearer the active layer, and p-type layers in opposite sides of the ridge having a thickness in the range from 0 to 100 nm, comprising:

growing layers from the active layer to the first layer of the p-side cladding layer in a carrier gas atmosphere containing nitrogen as a major component thereof and containing substantially no hydrogen.

According to the fifteenth aspect of the invention, there is provided a method of manufacturing a semiconductor light emitting device composed of nitride III-V compound semiconductors to have a structure interposing an active layer between an n-side cladding layer and a p-side cladding layer and have a ridge structure, the p-side cladding layer including an undoped or n-type first layer and a p-type second layer doped with a p-type impurity which lie in this order from one side nearer the active layer, and bottom surfaces of portions in opposite sides of the ridge being deeper than the boundary between the first layer and the second layer, comprising:

growing layers from the active layer to the first layer of the p-side cladding layer in a carrier gas atmosphere containing nitrogen as a major component thereof and containing substantially no hydrogen.

In the tenth to fifteenth aspects of the invention, the foregoing explanation made in conjunction with the first aspect of the invention is also applicable to the extent not contradictory to its nature.

According to the sixteenth aspect of the invention, there is provided a semiconductor light emitting device composed of nitride III-V compound semiconductors and having a structure interposing an active layer between an n-side cladding layer and a p-side cladding layer, comprising:

distance between the active layer and one of p-type layers doped with a p-type impurity nearest to the active layer being not less than 50 nm.

In the sixteenth aspect of the invention, for the purpose of more effectively preventing deterioration of the active layer by diffusion of the p-type impurity doped into p-type layers, distance between the active layer and nearest one of the p-type layers is preferably controlled no to be smaller than 60 nm, or more preferably not to be smaller than 100 nm. For the purpose of preventing deterioration of the active layer by diffusion of the p-type impurity, it is desirable to maximize the distance between the active layer and the p-type layers to the extent not inviting other difficulties. In general, it is not larger than 500 nm. The distance between the active layer and p-type layers is typically in the range from 50 to 500 nm, or more typically in the range from 100 to 200 nm. For the purpose of minimizing the internal loss while keeping the internal quantum efficiency in a high level, the distance between the active layer and p-type layers is preferably controlled in the range from 65 to 230 nm, more preferably in the range from 70 to 125 nm, and more preferably in the range from 90 to 110 nm. The p-type layer nearest to the active layer has a larger band gap than the p-side cladding layer, for example, which is equivalent to the third layer in the first aspect of the invention. Typically, at least one layer different in composition from the active layer and the nearest p-type layer is interposed between the active layer and this p-type layer.

According to the seventeenth aspect of the invention, there is provided a method of manufacturing a semiconductor light emitting device composed of nitride III-V compound semiconductors to have a structure interposing an active layer between an n-side cladding layer and a p-side cladding layer, in which the distance between the active layer and one of p-type layers doped with a p-type impurity nearest to the active layer is not less than 50 nm, and the p-type layer nearest to the active layer has a larger band gap than the p-side cladding layer, comprising:

growing layers from the active layer to said p-type layer having a larger band gap than the p-side cladding layer in a carrier gas atmosphere containing nitrogen as a major component thereof and containing substantially no hydrogen.

In the sixteenth and seventeenth aspects of the invention, the p-side cladding layer may be entirely a p-type layer, or may be made of an undoped or n-type first layer and a p-type second layer similarly to the first to fifteenth aspects of the invention. In the latter configuration, the explanation made in conjunction with the first to fifteenth aspects of the invention is applicable to the extent not contradictory to its nature.

In the tenth to fifteenth and seventeenth aspects of the invention, for the purpose of effectively preventing separation of In from layers containing In, such as the active layer, $N_2$ gas atmosphere is most preferably used as the carrier gas atmosphere containing substantially no hydrogen and containing nitrogen as its major component. On the other hand, for growth of p-type layers conducted after growth by using the carrier gas atmosphere containing substantially no hydrogen and containing nitrogen as its major component, a carrier gas atmosphere containing nitrogen and hydrogen as its major component is preferably used for the purpose of reducing resistance values of the p-type layers. Most preferably, a mixed gas atmosphere containing $N_2$ and $H_2$ is used.

The substrate for growth of the nitride III-V compound semiconductors may be selected from various kinds of substrates. More specifically; in addition to a sapphire substrate, SiC substrate, Si substrate, GaAs substrate, GaP substrate, InP substrate, spinel substrate, silicon oxide substrate, and the like, those made of thick GaN and other nitride III-V compound semiconductor layers are also usable.

For growth of the nitride III-V compound semiconductors, various techniques are usable, such as metal organic chemical vapor deposition (MOCVD), hydride vapor phase epitaxial growth, halide vapor phase epitaxial growth (HVPE), and so forth. For growth of all compound semiconductors including nitride III-V compound semiconductors, molecular beam epitaxy (MBE), for example, is also usable in addition to those techniques.

In the semiconductor light emitting device according to any of the first to ninth aspects of the invention, the p-side cladding layer is made of the undoped or n-type first layer and the p-type second layer. However, in a semiconductor light emitting device using as the material of the n-side cladding layer a semiconductor material difficult to dope an n-type impurity and difficult to obtain a low-resistance n-type semiconductor, it is also effective to make the n-side cladding layer of an undoped or p-type first layer and an n-type second layer. In this case, the ridge is formed in the part of the n-side cladding layer.

According to the eighteenth aspect of the invention, there is provided a semiconductor light emitting device having a structure interposing an active layer between an n-side cladding layer and a p-side cladding layer, comprising:

the n-side cladding layer including an undoped or p-type first layer and an n-type second layer doped with an n-type impurity in this order from one side nearer to the active layer, and the first layer having a thickness not smaller than 50 nm.

According to the nineteenth aspect of the invention, there is provided a semiconductor light emitting device having a structure interposing an active layer between an n-side cladding layer and a p-side cladding layer, and having a ridge structure, comprising:

the n-side cladding layer including an undoped or p-type first layer and an n-type second layer doped with an n-type impurity in this order from one side nearer to the active layer; and n-type layers in opposite sides of the ridge having a thickness in the range from 0 to 100 nm.

According to the twentieth aspect of the invention, there is provided a semiconductor light emitting device having a structure interposing an active layer between an n-side cladding layer and a p-side cladding layer, and having-a ridge structure, comprising:

the n-side cladding layer including an undoped or p-type first layer and an n-type second layer doped with an n-type impurity in this order from one side nearer to the active layer; and bottom surfaces of portions in opposite sides of the ridge being deeper than the boundary between the first layer and the second layer.

In the eighteenth to twentieth aspects of the invention, the foregoing explanation made in conjunction with the first to seventeenth aspects of the invention is also applicable to the extent not contradictory to its nature.

According to the first to ninth aspects of the invention, since the p-side cladding layer is made of the undoped or n-type first layer and the p-type second layer doped with a p-type impurity, which are stacked sequentially from nearer to remoter from the active layer, it is possible to control the thickness of the p-side cladding layer determining optical properties such as the light confinement coefficient Γ and the p-type second layer determining the level of the operation voltage independently from each other. Therefore, a semiconductor light emitting device reduced in operation voltage and having favorable optical properties (such as small θ⊥ of FPP) can be easily realized. In other words, it is possible to minimize the thickness of p-type layers with high specific resistance values causing an increase of the operation voltage and thereby reduce the operation voltage while keeping the p-side cladding layer thick enough to obtain a good light field for the semiconductor light emitting device and thereby obtain favorable optical properties. Additionally, since a sufficient distance can be provided between the active layer and the second layer, diffusion of the p-type impurity of the second layer into the active layer and deterioration of the active layer thereby can be prevented. At the same time, internal absorption loss of the laser can be reduced, and the laser property can be improved. Furthermore, especially when the second layer includes the p-type third layer having a larger band gap than the second layer, while the third layer prevents over flow of electrons injected to the active layer, deterioration of the active layer can be prevented because the distance between the active layer and the third layer usually having a large difference in composition from the active layer can be designed freely and distortion generated in the active layer can be relaxed.

According to the fourth to ninth aspects of the invention, since the thickness of n-type layers in opposite sides of the ridge is limited within 0 to 100 nm, or the bottoms of the portion in opposite sides of the ridge are deeper than the boundary between the first layer and the second layer, most or all of the p-type layers including the p-type second layer can be formed to lie inside the ridge. Therefore, leakage of the current injected during operation of the semiconductor light emitting device outside the ridge can be prevented effectively.

According to the tenth to fifteenth aspects of the invention, growth of layers from the active layer to the third layer in the tenth aspect of the invention, or growth of layers from the active layer to the first layer of the p-side cladding layer in the eleventh to fifteenth aspects of the invention, is carried out in the carrier gas atmosphere containing substantially no hydrogen and containing nitrogen as its major component. Therefore, separation of In from layers containing In, such as the active layer, can be prevented effectively. On the other hand, p-type layers to be grown thereafter may be grown in a carrier gas atmosphere containing nitrogen and hydrogen as its major component such that they grow with excellent crystalline properties.

According to the sixteenth aspect of the invention, since the distance between the active layer and the nearest p-type layer doped with the p-type impurity is at least 50 nm, diffusion of the p-type impurity from the p-type layer to the active layer can be reduced significantly, and deterioration of the active layer can be prevented.

According to the seventeenth aspect of the invention, since layers from the active layer to the p-side layer having a larger band gap than the p-side cladding layer are grown in the carrier gas atmosphere containing substantially no hydrogen and containing nitrogen as its major component, separation of In from layers containing In, such as the active layer, can be prevented effectively, and deterioration of the active layer can be prevented. The p-type layers to be grown thereafter may be grown in a carrier gas atmosphere containing nitrogen and hydrogen as its major component such that they grow with excellent crystalline properties.

According to the eighteenth to twentieth aspects of the invention, since the n-side cladding layer is made of the undoped or p-type first layer and the n-type second layer doped with an n-type impurity, which are stacked sequentially from nearer to remoter from the active layer, it is possible to control the thickness of the n-side cladding layer determining optical properties such as the light confinement coefficient Γ and the n-type second layer determining the level of the operation voltage independently from each other. Therefore, a semiconductor light emitting device reduced in operation voltage and having favorable optical properties (such as small θ⊥ of FPP) can be easily realized. In other words, it is possible to minimize the thickness of n-type layers with high specific resistance values causing an increase of the operation voltage and thereby reduce the operation voltage while keeping the n-side cladding layer thick enough to obtain a good light field for the semiconductor light emitting device and thereby obtain favorable optical properties. Additionally, since a sufficient distance can be provided between the active layer and the second layer, diffusion of the n-type impurity of the second layer into the active layer and deterioration of the active layer thereby can be prevented.

Furthermore, according to the nineteenth and twentieth aspects of the invention, since the thickness of p-type layers in opposite sides of the ridge is limited within 0 to 100 nm, or the bottoms of the portion in opposite sides of the ridge are deeper than the boundary between the first layer and the second layer, most or all of the n-type layers including the n-type second layer can be formed to lie inside the ridge. Therefore, leakage of the current injected during operation of the semiconductor light emitting device outside the ridge can be prevented effectively.

DETAILED DESCRIPTION OF THE PREFERRED EMBODIMENTS

Figure 1:
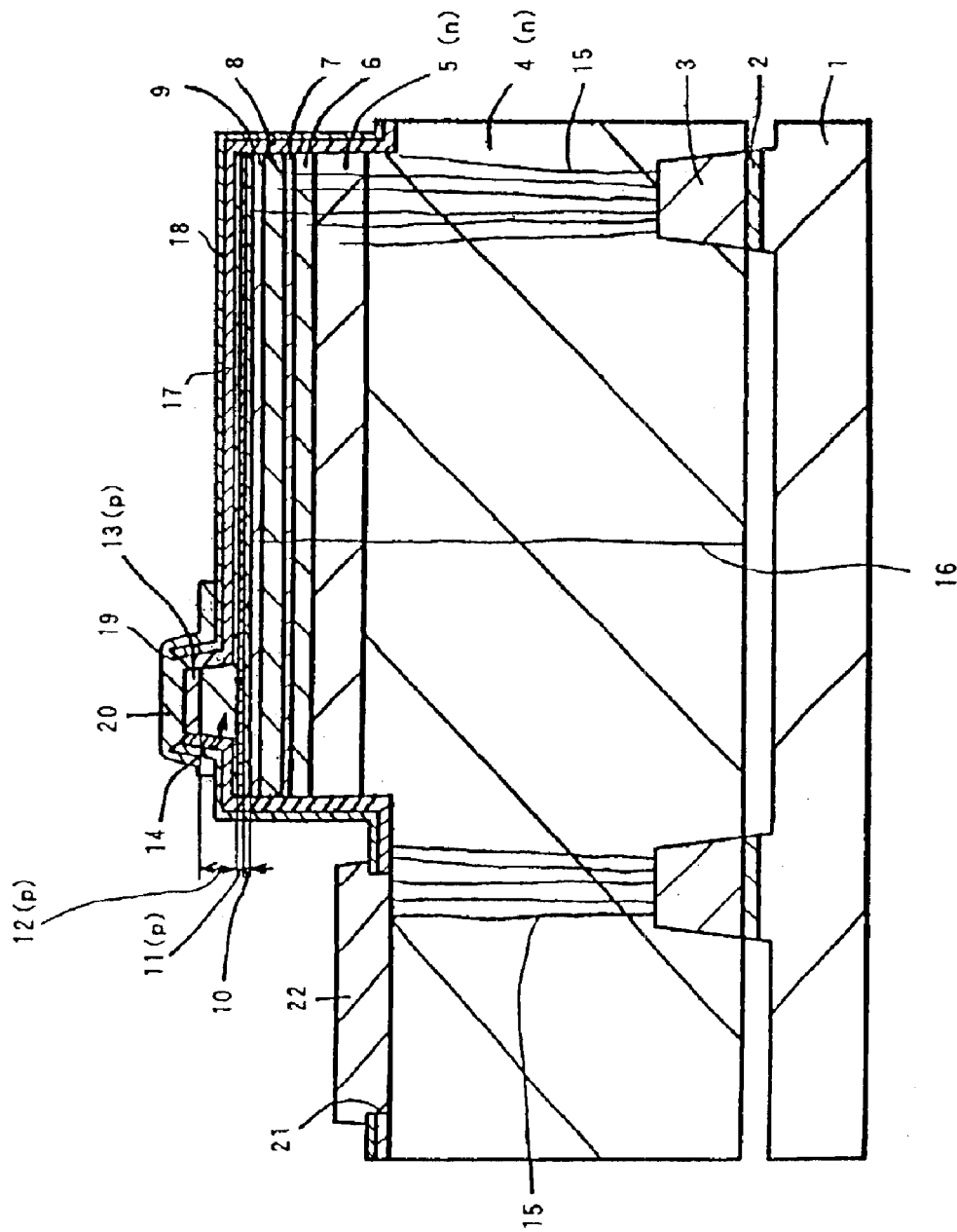
FIG. 1 is a cross-sectional view showing a GaN compound semiconductor laser according to the first embodiment of the invention.

Some embodiments of the invention will now be explained below with reference to the drawings. In all figures showing the embodiments, common or equivalent elements are labeled with common reference numerals.

Figure 2:
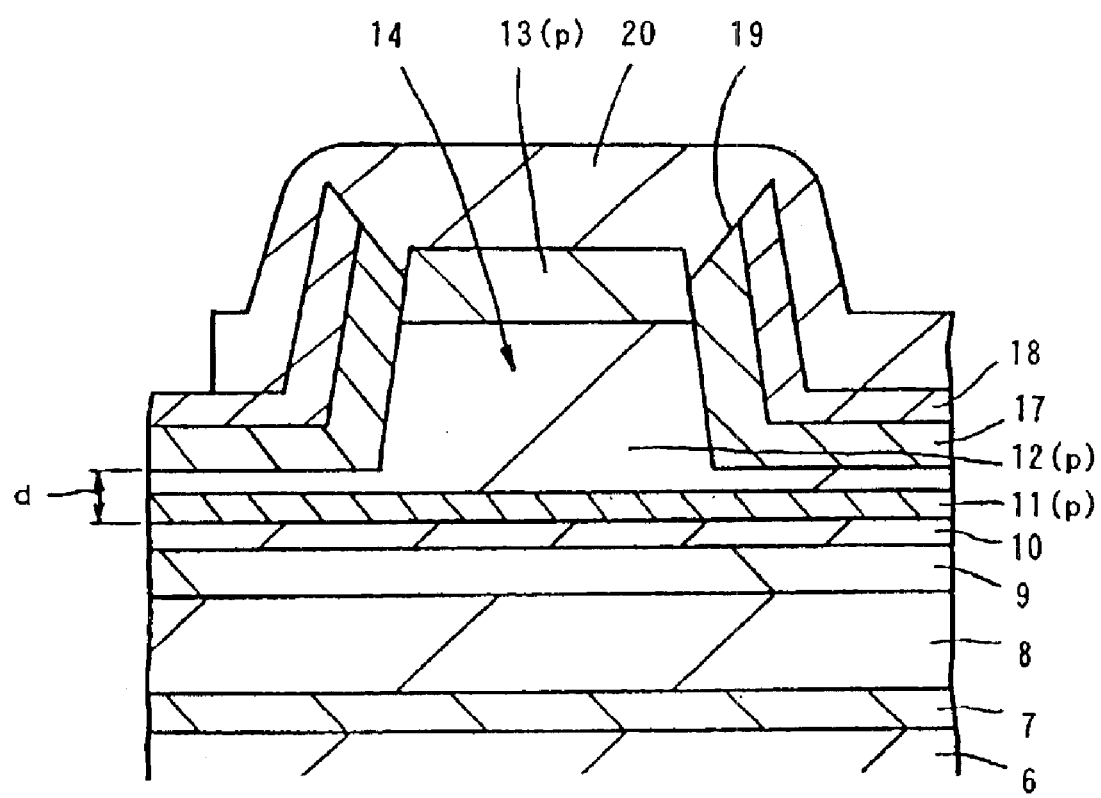
FIG. 2 is a cross-sectional view showing a substantial part of the GaN compound semiconductor laser according to the first embodiment in an enlarged scale.
Figure 3:
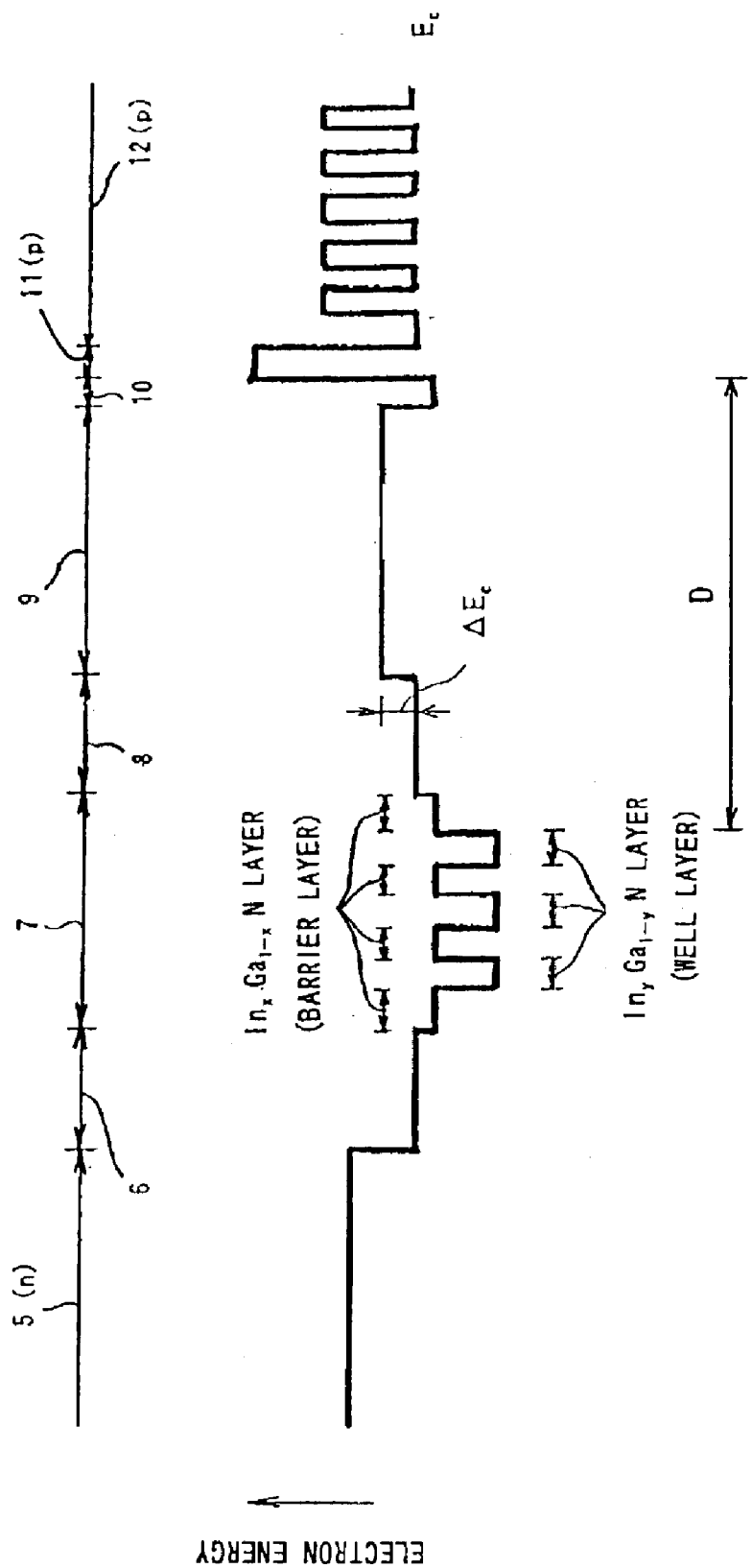
FIG. 3 is a schematic diagram showing the energy band structure of the GaN semiconductor laser according to the first embodiment.

FIG. 1 shows a GaN compound semiconductor laser according to the first embodiment of the invention. The GaN compound semiconductor laser has a ridge structure and a SCH structure. FIG. 2 is an enlarged, cross-sectional view of the ridge portion and its peripheral portion of the GaN compound semiconductor. FIG. 3 shows the energy bands, especially the conduction band, of the GaN compound semiconductor laser.

As shown in FIG. 1, in the GaN compound semiconductor laser according to the first embodiment, GaN compound semiconductor layers are deposited on one major surface of a c-plane sapphire substrate 1 by a lateral crystal growth technique (for example, Applied Physics Letters vol. 75(1999) pp.196–198). More specifically, the GaN compound semiconductor laser includes a stripe made of an undoped GaN buffer layer 2 by low-temperature growth on one major surface of the c-plane sapphire substrate 1 and an undoped GaN compound semiconductor layer 3 on the buffer layer 2 to form a stripe extending in the (1–100) direction. Further, an n-type GaN contact layer 4 is grown as a continuous layer from the undoped GaN layer 3 in the stripe as the seed crystal. In opposite sides of the stripe, a surface portion of the c-plane sapphire substrate is removed as well, and the n-type GaN contact layer 4 in these portions is configured to float from the c-plane sapphire substrate 1. On the n-type GaN contact layer 4, there are sequentially formed an n-type GaN cladding layer 5, undoped InGaN optical waveguide layer 6 as the n-side optical waveguide layer, active layer of an $In_xGa_{1-x}N/In_yGa_{1-y}N$ multiquantum well structure, undoped InGaN optical waveguide layer 8 as the p-side optical waveguide layer, undoped AlGaN cladding layer 9 as the p-side cladding layer, undoped cladding layer, undoped InGaN layer 10, p-type AlGaN electron-blocking layer 11, p-type AlGaN/GaN superlattice cladding layer 12 as the p-side cladding layer, and p-type GaN contact layer 13. The undoped InGaN optical waveguide layer 6, undoped InGaN optical waveguide layer 8, undoped AlGaN cladding layer 9 and undoped InGaN layer 10 are $n^-$-type layers. The purpose of using the p-type AlGaN/GaN superlattice cladding layer 12 as the p-side cladding layer is to permit holes to pass through more easily by tunneling.

Thickness of the undoped GaN buffer layer 2 is 30 nm for example. The undoped GaN layer 3 is 2 μm thick for example. The n-type GaN contact layer 4 is 4 μm for example, and it is doped with silicon (Si) for example as its n-type impurity. The n-type AlGaN cladding layer 5 is 1,2 μm thick for example, and doped with Si for example as its n-type impurity. Its Al composition ratio may be 0.065 for example. The undoped InGaN optical waveguide layer 6 is 30 nm thick for example, and its In composition ratio is 0.02 for example. The active layer 7 having the undoped $In_xGa_{1-x}N/In_yGa_{1-y}N$ multiquantum well structure is a multi-layered film made by alternately stacking $In_xGa_{1-x}N$ layers as barrier layers and $In_yGa_{1-y}$ N layers as well layers. For example, thickness of each $In_xGa_{1-x}N$ layer as the barrier layer may be 7 nm, and x=0.02, for example. Thickness of each $In_yGa_{1-y}$ N layer may be 3.5 nm, y=0.08, and the number wells is 3, for example.

The undoped InGaN optical waveguide layer 8 is 30 nm thick, for example, and its In composition ratio is 0.02, for example. The undoped AlGaN cladding layer 9 is 100 nm thick, for example, and its Al composition ratio is 0.025, for example. The undoped InGaN layer 10 is 5 nm thick, for example, and its In composition ration is 0.02, for example. The p-type AlGaN electron blocking layer 11 is 10 nm thick, for example, and its Al composition ratio is 0.18, for example. The p-type AlGaN/GaN superlattice cladding layer 12 may include 2.5 nm thick undoped AlGaN layers as barrier layers and 2.5 nm thick, Mg-doped GaN layers as well layers, which are alternately stacked. Thus, the average Al composition ratio is 0.06 for example, and the total thickness is 400 nm, for example. The p-type GaN contact layer 11 is 100 nm thick, for example, and Mg, for example, is doped as its p-type impurity.

The upper part of the n-type GaN contact layer 4 and other overlying layers make the form of a mesa of a predetermined width as a whole. In this mesa portion, the p-type AlGaN/GaN superlattice cladding layer 12 and the p-type GaN contact layer 13 make a ridge 14 extending in the <1–100> orientation, for example. Width of this ridge 14 is 1.6 μm, for example. This ridge, which is the laser stripe portion, is located in a low defective region between the transition 15 propagating from the seed crystal for lateral crystal growth and the associating portion of lateral growth from adjacent seed crystals.

In this case, the total thickness d (FIG. 2) of the p-type layers in opposite sides of the ridge 14, namely the p-type AlGaN electron blocking layer 11 and the p-type AlGaN/GaN cladding layer 12 in this example, is in the range from 0 to 100 nm, or preferably in the range from 0 to 50 nm.

In form of covering the entirety of the mesa portion, an insulating layer 17 such as 40 nm thick $SiO_2$ film, for example, and a 45 nm thick Si film 18, for example, are formed sequentially. The insulating film 17 is used for electrical insulation and protection of the surface. The Si film 18 is used for enhancing the absorption coefficient of the primary mode of laser light, which may invite kink phenomenon, in the sidewall portions of the ridge 14. The insulating film 17 and the Si film 18 have an opening 19 in the location above the ridge 14, and the p-side electrode 20 contacts the p-type GaN contact layer 13 through the opening 19. The p-side electrode 20 has a structure made by sequentially stacking a Pd film, Pt film and Au film, which may be 10 nm thick, 100 nm thick and 300 nm thick, respectively. On the other hand, the insulating film 17 and the Si film 18 have another opening 21 in a predetermined location adjacent the mesa portion, and the n-side electrode 22 contacts the n-type GaN contact layer 4 through the opening 21. The n-side electrode 22 has a structure made by sequentially stacking a Ti film, Pt film and Au film, which may be 10 nm thick, 50 nm thick and 100 nm thick, respectively.

Next explained is a method of manufacturing the GaN compound semiconductor laser according to the first embodiment.

First prepared is a c-plane sapphire substrate 1 with a surface cleaned by thermal cleaning, for example. Then the undoped GaN buffer layer 2 is grown on the c-plane sapphire substrate 1 by metal organic chemical vapor deposition (MOCVD) at a temperature around 500° C., for example. Thereafter, the undoped GaN layer 3 is grown again by MOCVD at the growth temperature of 1000° C., for example.

After that, a $SiO_2$ film (not shown), 100 nm thick for example, is formed on the entire surface of the undoped GaN layer 3 by CVD, vacuum evaporation or sputtering, for example. Then a resist pattern (not shown) of a predetermined configuration is formed on the $SiO_2$ film by lithography. Next using this resist pattern as a mask, the $SiO_2$ film is selectively etched and patterned by wet etching using a hydrofluoric acid-based etching liquid, or RIE using a gas containing fluorine such as $CF_4$ or $HF_3$. Next using the $SiO_2$ film having the predetermined configuration as a mask, the underlying layers are selectively etched by RIE, for example, until the top portion of the c-plane sapphire substrate 1 is removed. In this RIE, a chlorine-based gas may be used as the etching gas. As a result of the etching, the undoped GaN layer 3 as the seed crystal is made out in form of a stripe. The extending direction of the stripe-shaped undoped GaN layer 3 is the <1–100> direction.

In the next process, the $SiO_2$ film used as the etching mask is removed, and the n-type GaN contact layer 4 is grown from the stripe-shaped undoped GaN layer 3 as the seed crystal by the aforementioned lateral crystal growth technique. The growth temperature in this process may be 1070° C. for example.

Subsequently, the n-type AlGaN cladding layer 5, undoped InGaN optical waveguide layer 6, active layer 7 having the undoped $Ga_{1-x}In_xN/Ga_{1-y}In_yN$ multiquantum well structure, undoped InGaN optical guide layer 8, undoped AlGaN cladding layer 9, undoped InGaN layer 10, p-type AlGaN electron blocking layer 11, p-type AlGaN/GaN superlattice cladding layer 12 and p-type GaN contact layer 13 are sequentially grown on the n-type GaN contact layer 4 by MOCVD. For growth of these layers, the temperature is adjusted to, for example, 900~1000° C. for the n-type AlGaN cladding layer 5, 780° C. from the undoped InGaN optical waveguide layer 6 to the p-type AlGaN electron blocking layer 11, and 900~1000° C. for the p-type AlGaN/GaN superlattice cladding layer 12 and the p-type GaN contact layer 13.

Materials for growth of these GaN compound semiconductor layers may be, for example, trimethyl gallium ($(CH_3)_3Ga$, TMG) as the material of Ga, trimethyl aluminum ($(CH_3)_3Al$, TMA) as the material of Al, trimethyl indium ($(CH_3)_3In$, TMI) as the material of In and $NH_3$ as the material of N. Dopants may be, for example, silane ($SiH_4$) as the n-type dopant, and bis=methylcyclopentadienile magnesium ($(CH_3C_5H_4)_2Mg$) or bis=cyclopentadienile magnesium ($(CH_5H_5)_2Mg$) as the p-type dopant.

Carrier gas atmospheres during growth of these GaN compound semiconductor layers may be, for example, a mixture gas of $N_2$ and $H_2$ for the n-type GaN contact layer 4 and the n-type AlGaN cladding layer 5, $N_2$ gas atmosphere from the undoped InGaN optical waveguide layer to the p-type AlGaN electron blocking layer 11, and mixture gas of $N_2$ and $H_2$ for the p-type AlGaN/GaN superlattice cladding layer 12 and the p-type GaN contact layer 13. In this case, for growth of the layers from the undoped InGaN optical waveguide layer 6 to the p-type AlGaN electron blocking layer 11, $N_2$ gas atmosphere is used as the carrier gas atmosphere, and the carrier gas atmosphere does not contain $H_2$. Therefore, separation of In from the undoped InGaN optical waveguide layer 6, active layer 7, undoped InGaN optical waveguide layer 8 and undoped InGaN layer 10 can be prevented, and these layers can be protected from deterioration. Additionally, since the mixture gas of $N_2$ and $H_2$ is used as the carrier gas atmosphere during growth of the p-type AlGaN/GaN superlattice cladding layer 12 and the p-type GaN contact layer 13, these p-type layers can be grown to have good crystalline properties.

In the next process, the c-plane sapphire substrate having those GaN compound semiconductor layers grown thereon as explained above is removed from the MOCVD apparatus. Then, after a $SiO_2$ film, 0.1 μm thick for example, is formed on the entire surface of the p-type GaN contact layer 13 by CVD, vacuum evaporation or sputtering, for example, a resist pattern (not shown) of a predetermined configuration corresponding to the shape of the mesa portion is formed on the $SiO_2$ film by lithography. Next using this resist pattern as a mask, the $SiO_2$ film is selectively etched and patterned by wet etching using a hydrofluoric acid-based etching liquid, or RIE using a gas containing fluorine such as $CF_4$ or $HF_3$. Next using the $SiO_2$ film having the predetermined configuration as a mask, the underlying layers are selectively etched by RIE, for example, to a depth reaching the n-type GaN contact layer 4. In this RIE, a chlorine-based gas may be used as the etching gas. As a result of the etching, upper part of the n-type GaN contact layer 4, n-type AlGaN cladding layer 5, undoped InGaN optical waveguide layer 6, active layer 7, undoped InGaN optical waveguide layer 8, undoped AlGaN cladding layer 9, undoped InGaN layer 10, p-type AlGaN electron blocking layer 11, p-type AlGaN/GaN superlattice cladding layer 12 and p-type GaN contact layer 13 are patterned to the form of a mesa.

In the next process, after the $SiO_2$ film used as the etching mask is removed, a $SiO_2$ film (not shown), 0.2 μm thick for example, is formed again on the entire substrate surface by CVD, vacuum evaporation or sputtering, for example. After that, a resist pattern (not shown) of a predetermined configuration corresponding to the ridge portion is formed on the $SiO_2$ film by lithography. Next using this resist pattern as a mask, the $SiO_2$ film is selectively etched to a pattern corresponding to the ridge portion by wet etching using a hydrofluoric acid-based etching liquid, or RIE using a gas containing fluorine such as $CF_4$ or $HF_3$.

In the next process, using the $SiO_2$ film as a mask, etching is carried out by RIE until the total thickness of the remaining p-type AlGaN/GaN superlattice cladding layer 12 and the p-type AlGaN electron blocking layer 11 falls in the range from 0 to 100 nm or preferably in the range from 0 to 50 nm to make out the ridge 14. In this RIE, a chlorine-based gas may be used as the etching gas.

In the next process, the $SiO_2$ film used as the etching mask is removed, and the insulating film 17 such as $SiO_2$ film and the Si film 18 are sequentially formed on the entire substrate surface by CVD, vacuum evaporation or sputtering, for example.

In the next process, a resist pattern (not shown) is formed by lithography to cover the surface of the Si film 18 in the region excluding the region for making the n-side electrode.

Next using this resist pattern as a mask, the Si film 18 and the insulating film 17 are selectively etched to make the opening 21.

In the next process, while maintaining the resist pattern, a Ti film, Pt film and Au film are sequentially deposited on the entire substrate surface by vacuum evaporation, for example. Thereafter, the resist pattern and the overlying Ti film, Pt film and Au film are removed together (lift-off). As a result, the n-side electrode 22 in contact with the n-type GaN contact layer through the opening 21 in the insulating film 17 and the Si film 18 appears. Thereafter, alloying is carried out to bring the n-side electrode 22 into ohmic contact.

Thereafter, through similar processes, the Si film 18 and the insulating film 17 are removed from above the ridge 14 by etching to form an opening 19. Thereafter, similarly to the n-side electrode 22, the p-side electrode 20 having the Pd/Pt/Au structure in contact with the p-type GaN contact layer through the opening 19 is formed.

After that, the substrate having formed the laser structure through the foregoing steps is processed to bars by cleavage or the like to form opposite cavity edges, and after coating these cavity edges, each bar is divided to chips by cleavage or the like.

As a result, the intended GaN compound semiconductor laser having the ridge structure and the SCH structure is completed.

Figure 5:
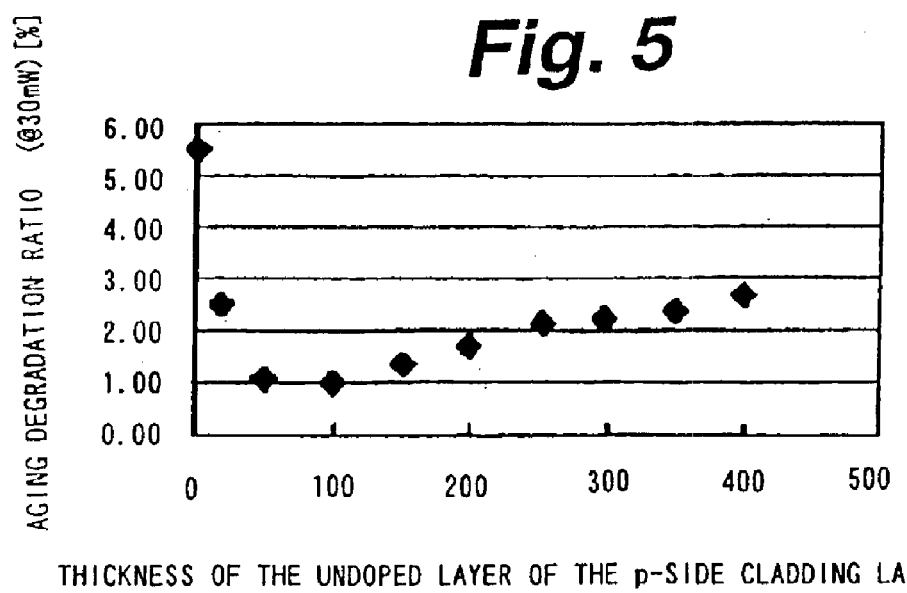
FIG. 5 is a schematic diagram showing changes of the aging deterioration rate of with thickness of the undoped layer of the p-side cladding layer in the GaN compound semiconductor laser according to the first embodiment.

With this GaN compound semiconductor laser, thickness t of the undoped AlGaN cladding layer 9 in the p-side cladding layer made of the undoped AlGaN cladding layer 9 and the p-type AlGaN/GaN superlattice cladding layer 12 was changed. A result of examining corresponding operation voltage values and aging deterioration rates are shown in FIG. 5. These operation voltage values were obtained at 25° C. under the optical output of 30 mW. The aging deterioration rates were obtained at 60° C. under the optical output of 30 mW. Since the rising rate of the operation current $I_{op}$ is high immediately after the start of aging, rising rates of $I_{op}$ from 100 to 300 hours were employed. The initial operation current $I_{op}$ was 55 mA. the specific resistance of the undoped AlGaN cladding layer 9 is around one of several parts of 1 $\Omega$cm, and the specific resistance of the p-type AlGaN/GaN superlattice cladding layer 12 is around 2 $\Omega$cm. The cavity length was 600 $\mu$m (0.06 cm), width of the ridge 14 was 1.6 $\mu$m, and the entire thickness of the p-side cladding layer was 500 nm.

TABLE 1

| t (nm) | Operation Voltage (V) | Aging Deterioration Rate (%) |
|---|---|---|
| 0 | 5.13 | 5.50 |
| 20 | 5.08 | 2.50 |
| 50 | 4.99 | 1.10 |
| 100 | 4.85 | 1.00 |
| 150 | 4.70 | 1.30 |
| 200 | 4.56 | 1.70 |
| 250 | 4.42 | 2.10 |
| 300 | 4.27 | 2.20 |
| 350 | 4.13 | 2.30 |
| 400 | 3.99 | 2.70 |

Figure 4:
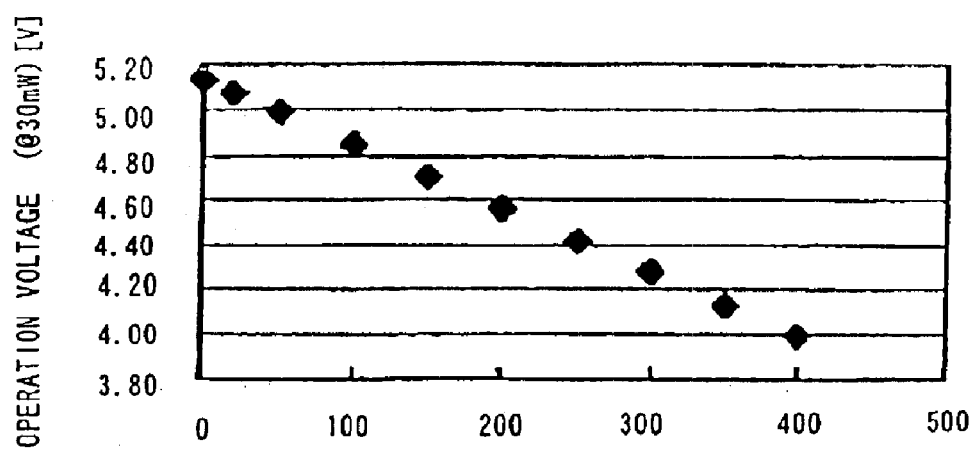
FIG. 4 is a schematic diagram showing changes of the operation voltage with thickness of the undoped layer of the p-side cladding layer in the GaN compound semiconductor laser according to the first embodiment.

If the operation voltage under 30 mW (25° C.) is preferably not higher than 5 V, and the aging deterioration rate is considered to be in a practical level when the rising rate of the operation current is not higher than 20% after operation of 3000 hours, it is understood from Table 1, FIGS. 4 and 5 that the thickness of the undoped AlGaN cladding layer 9 must be at lest 50 nm to satisfy those conditions. Further, the thickness of the undoped AlGaN cladding layer 9 is preferably in the range from 50 to 250 nm from the viewpoint of the aging deterioration rate.

Figure 6:
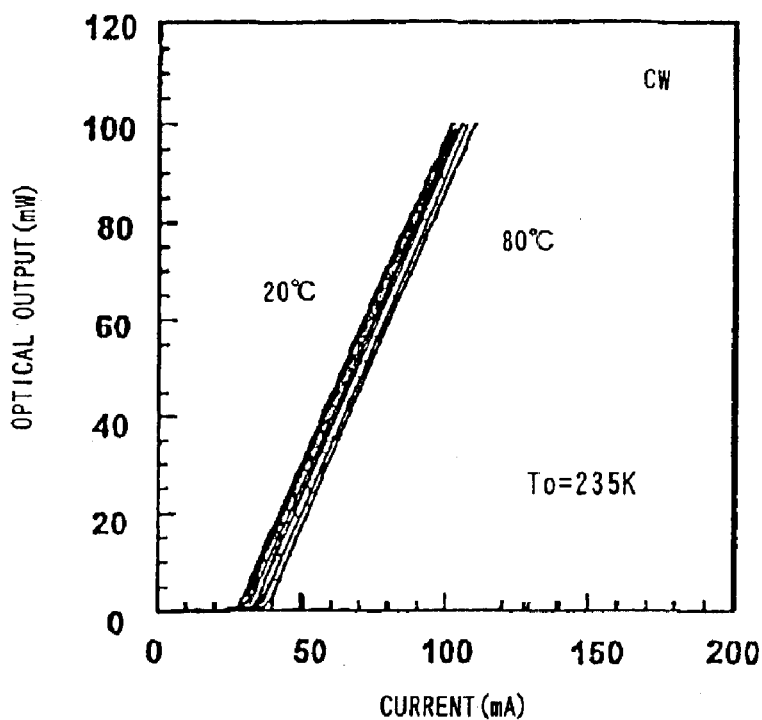
FIG. 6 is a schematic diagram showing the optical output-to-current property of the GaN compound semiconductor laser according to the first embodiment.
Figure 7:
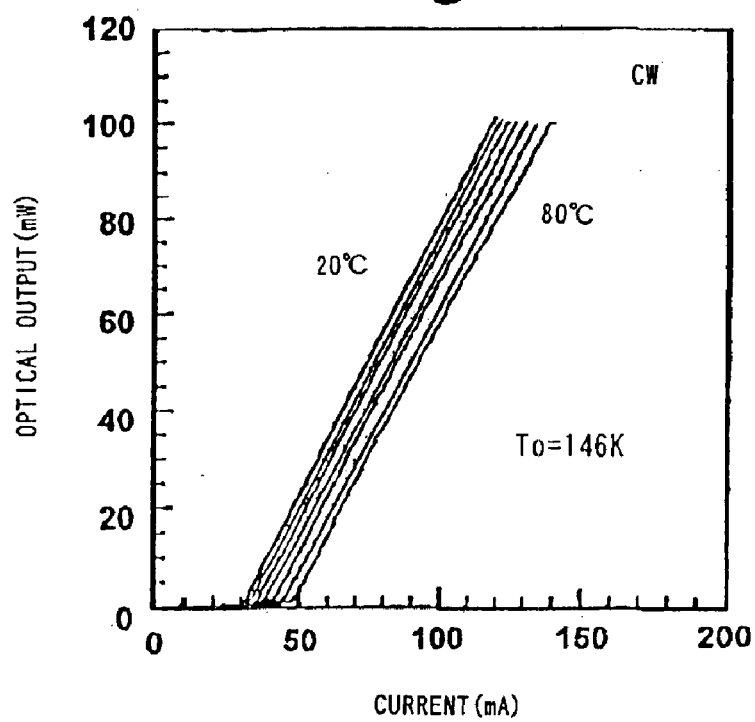
FIG. 7 is a schematic diagram showing the optical output-to-current property of an existing GaN compound semiconductor laser taken for comparison with the GaN compound semiconductor laser according to the first embodiment.

Changes of the optical output to current property of the GaN compound semiconductor laser were measured by changing the environmental temperature by 10° C. from 20° C. to 80° C. A result of the measurement is shown in FIG. 6. For comparison purposes, a result of similar measurement with an existing GaN compound semiconductor laser developed by the same Inventor (Paper for 48th Lecture of Applied Physics Related Union, 28p-E-12(2001), p.369) is shown in FIG. 7. It is appreciated from FIG. 6 that the characteristic temperature $T_0$ of this GaN compound semiconductor laser is 235 K. However, it is appreciated from FIG. 7 that the characteristic temperature of the existing GaN compound semiconductor laser is 146 K. That is, the characteristic temperature $T_0$ of this GaN compound semiconductor laser is higher than that of the existing GaN semiconductor laser by as much as 90 K. The value 235 K as the characteristic temperature $T_0$ is a significantly high value that was impossible to obtain even with semiconductor lasers of other compounds. Additionally, when FIG. 6 is compared with FIG. 7, it is appreciated that the inclination of the optical output to current characteristic, which is the slope efficiency, of this GaN compound semiconductors is considerably higher than that of the existing GaN compound semiconductor laser.

According to the first embodiment, the following various advantages are ensured. Since the p-side cladding layer is made of the undoped AlGaN cladding layer 9, 105 nm thick for example, and the p-type AlGaN/GaN superlattice cladding layer 12, 400 nm thick for example, in this order from one side nearer to the active layer 7, the operation voltage of the GaN compound semiconductor laser can be reduced by approximately 0.16 V from that of a structure in which the entirety of the p-side cladding layer is the p-type AlGaN/GaN cladding layer 12. Additionally, since the entire p-side cladding layer is approximately 500 nm thick and sufficiently thick, light can be sufficiently confined in the p-side, and favorable FFP can be obtained. That is, the operation voltage can be reduced by decreasing the thickness of the p-type AlGaN/GaN superlattice cladding layer 12 causing an increase of the operation voltage by the thickness as large as 100 nm while maintaining the thickness of the p-side cladding layer necessary for obtaining favorable optical characteristics.

Additionally, since the distance from the active layer 7 to the Mg-doped p-type layers, i.e. the p-type AlGaN electron blocking layer 11, p-type AlGaN/GaN superlattice cladding layer 12 and p-type GaN contact layer 13, is as large as the total thickness of the undoped InGaN optical waveguide layer 8, undoped AlGaN cladding layer 9 and undoped InGaN layer 10, which may be 30 nm+100 nm+5 nm=135 nm, diffusion of Mg from the p-type layers into the active layer 7 can be prevented efficiently during crystal growth or aging, for example, and the active layer 7 can be prevented from deterioration caused by diffusion of Mg. As a result, the aging deterioration rate of the GaN compound semiconductor layer can be reduced, and the reliability and the production yield can be improved.

Further, since the undoped AlGaN cladding layer, which is a lattice distortion layer, exists between the active layer and Mg-doped p-type layers, this also contributes to preventing diffusion of Mg from the p-type layers into the active layer and to more effectively preventing the active layer 7 from deterioration.

Furthermore, since Mg-doped p-type layers in general are inferior in crystalline property to n-type layers and are liable to suffer absorption of light, if the p-type layers are located near the active layer 7, the light absorption coefficient α will increase. In this embodiment, however, since the p-type layers are distant from the active layer 7 by as much as 135 nm, α near the active layer 7 can be kept sufficiently low. As a result, the threshold current density $J_{th}$ of the GaN compound semiconductor laser and hence the threshold current $I_{th}$ can be reduced, and the slope efficiency can be improved simultaneously. Additionally, since the Mg-doped p-type layers not good in crystalline property are sufficiently distant from near the active layer 7 having a high density of light, crystals near the active layer 7 are not deteriorated so much by light, and the GaN compound semiconductor laser can be enhanced in lifetime and reliability.

Moreover, although there is a large difference of lattice constant between the p-type AlGaN electron blocking layer 11 having the Al composition ratio as large as 0.18 and the active layer 7 made of InGaN layers, since they are distant by as much as 135 nm, distortion generated in the active layer 7 by the lattice constant difference can be relaxed, and the emission efficiency can be improved accordingly. This results in improving the quantum efficiency, decreasing the threshold current density $J_{th}$ and hence the threshold current $I_{th}$, and improving the slope efficiency.

Further, since the undoped InGaN layer 10 having the lattice constant substantially equal to that of the active layer is interposed between the undoped AlGaN cladding layer 9 and the p-type AlGaN electron blocking layer 11, even if there is a large difference between the lattice constant of the active layer and the lattice constants of the p-type AlGaN electron blocking layer 11 and the p-type AlGaN/GaN superlattice cladding layer 12, distortion generated in the active layer 7 due to the p-type AlGaN electron blocking layer 11 and the p-type AlGaN/GaN superlattice cladding layer 12 can be relaxed. This contributes to reducing the threshold current density $J_{th}$ and hence the threshold current $I_{th}$ of the GaN compound semiconductor laser and improving the slope efficiency.

Reduction of the threshold current $I_{th}$ further leads to improvement of the noise property of the GaN compound semiconductor laser.

When electrons injected into the active layer run through the active layer 7 and reach the undoped AlGaN cladding layer 9, some electrons having energies larger than the energy difference $\Delta E_c$ (FIG. 3) of the conduction band between the undoped InGaN optical waveguide layer 8 and the undoped AlGaN cladding layer 9 lose energies corresponding to $\Delta E_c$ when they jump over the undoped AlGaN cladding layer 9. The other electrons originally having energies smaller than $\Delta E_c$ cannot jump over the undoped AlGaN cladding layer 9 and remain in the undoped InGaN optical waveguide layer 8. Since the energy and number of electrons tending to jump over the undoped AlGaN cladding layer 9 decrease, the slope efficiency of the GaN compound semiconductor laser can be improved. It is also possible to prevent overflow of electrons during high-temperature, high-output driving of the GaN compound semiconductor laser and to reduce the operation current and operation voltage of the GaN compound semiconductor laser.

Most part of the p-type layers is positioned inside the ridge 14, and the p-type layers existing outside the ridge 14 are limited to the p-type AlGaN/GaN superlattice cladding layer 12 having a total thickness within 100 nm or preferably within 50 nm and the 10 nm thick p-type AlGaN electron blocking layer 11. Thus they are sufficiently thin and their lateral resistance is sufficiently high. Therefore, even when the operation temperature of the GaN compound semiconductor laser rises and results in lowering the resistance of those p-type layer due to activated Mg therein, the current leaking to opposite sides of the ridge 14 is very small. This contributes to remarkably increasing the characteristic temperature $T_0$ of the GaN compound semiconductor laser to as high as 236K. Furthermore, the existing GaN compound semiconductor laser using only p-type layers as all of the p-side cladding layers needs considerably deep etching for making the ridge when it is intended to reduce the thickness of the p-type layers in opposite sides of the ridge, and if they are etched deeply, the difference Δn in refraction index increases between the inside and outside the ridge, and kinks will easily occur. Further, the p-type layers are deeply etched by RIE, plasma damage occurs in the active layer 7, and it may deteriorate the characteristics of the GaN compound semiconductor laser. In contrast, the GaN compound semiconductor laser according to the instant embodiment is free from those problems even when the depth of the ridge 14 is equivalent to that of the existing GaN compound semiconductor laser, and can adjust the thickness of the p-type layers in opposite sides of he ridge 14 not to exceed 100 nm or preferably not to exceed 50 nm as explained above.

Since the activation energy of holes in the p-type AlGaN electron blocking layer 11 is high, most of holes are inactive at room temperatures. However, as the temperature increases, holes are activated, and the electron blocking effect of the p-type AlGaN electron blocking layer is enhanced. It is presumed that this effect was difficult to ascertain in the existing GaN compound semiconductor laser because a large quantity of current leaked to opposite sides of the ridge. In the GaN compound semiconductor laser, however, the quantity of the leak current to opposite sides of the ridge 14 is vary small as explained above, the electron blocking effect by the p-type AlGaN electron blocking layer 11 is high, and electrons are effectively prevented from overflow even during high-temperature, high-output driving.

Above-mentioned reduction of the leak current, i.e. the useless current, during high-temperature driving contributes to reducing the threshold current $I_{th}$ and to realizing a GaN compound semiconductor laser with low noise even at high temperatures.

The above-explained remarkable improvement of the characteristics temperature $T_0$ enables improvement of the so-called droop characteristic. The droop characteristic is an important parameter for application of the GaN compound semiconductor laser to a light source of laser beam printer or the like. Even when a plurality of GaN compound semiconductor lasers are integrated closely on a common substrate, since the GaN compound semiconductor lasers have a very high characteristic temperature $T_0$, thermal cross talk among the GaN compound semiconductors is minimized. Therefore, the GaN compound semiconductor laser according to the instant embodiment is suitable for use in a multi-beam laser as well.

Since the undoped AlGaN cladding layer 9 forms a part of the p-side cladding layer, less p-type layers exist as a whole in the p-side of the active layer 7, and the probability that electrons overflowing from the active layer 7 are trapped into recombination centers and run to non-emitting recombination is small. Assuming that the probability of electrons being trapped in p-type layers increases as the temperature increases, this structure of GaN compound semiconductor laser will be effective for reducing useless current.

Since the carrier gas atmosphere used for growth of the layers from the undoped InGaN optical waveguide layer to the p-type AlGaN electron blocking layer 11 is $N_2$ atmosphere, and does not contain $H_2$, separation In especially from the active layer 7 is prevented, and deterioration of the active layer 7 is prevented. Therefore, the GaN compound semiconductor laser is improved in reliability and lifetime.

Thus the first embodiment can realize a GaN compound semiconductor laser low in operation voltage and threshold current, excellent in temperature characteristic, and having a long lifetime and high reliability.

The GaN compound semiconductor laser according to the first embodiment, reduced in operation current and operation voltage during high-temperature, high-output driving, and having a long lifetime, is suitable for use as a high-throughput semiconductor laser for writing especially with an optical disc.

Figure 8:
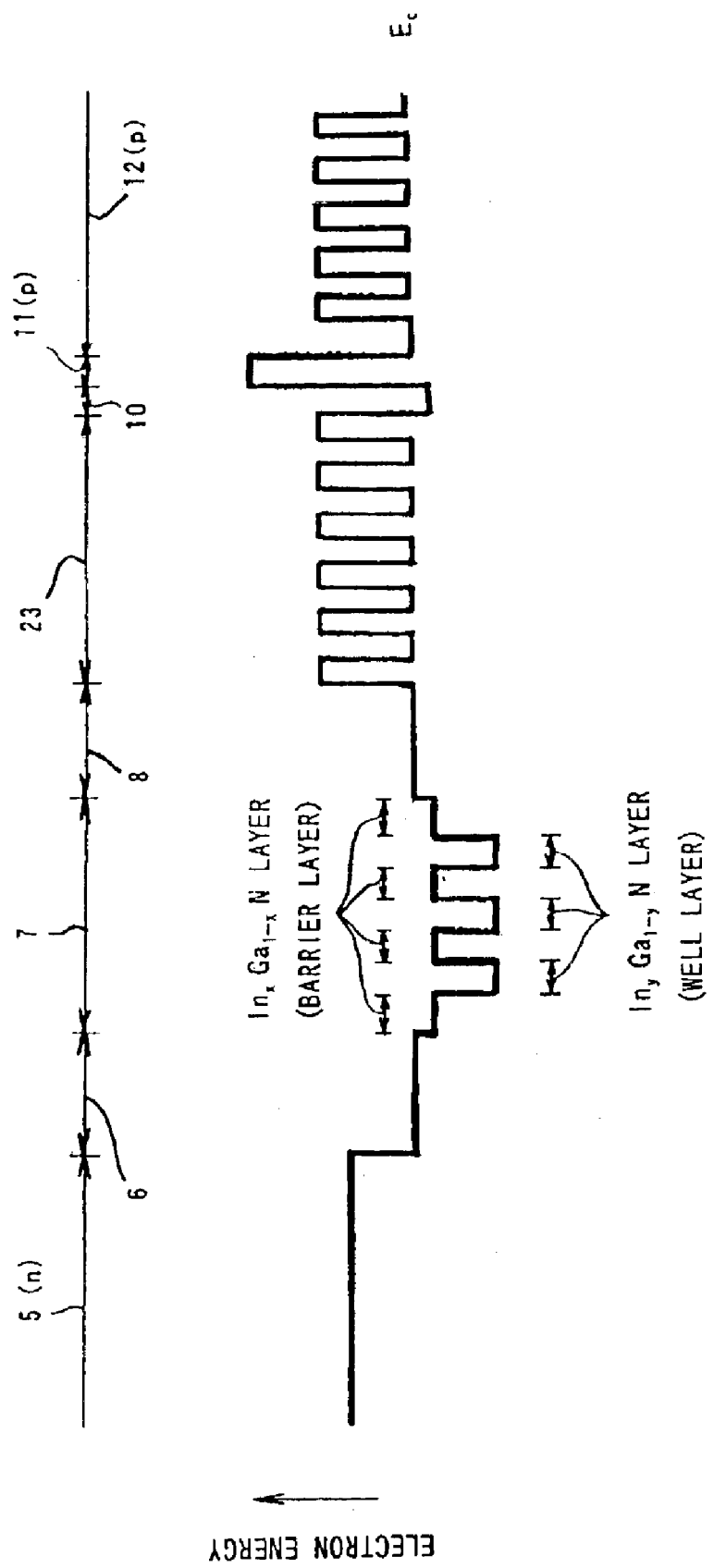
FIG. 8 is a schematic diagram showing the energy band structure of a GaN compound semiconductor laser according to the second embodiment of the invention.

Next explained is a GaN compound semiconductor laser according to the second embodiment of the invention. FIG. 8 shows the energy band structure of this GaN compound semiconductor laser.

As shown in FIG. 8, the GaN semiconductor compound semiconductor laser according to the second embodiment includes an undoped AlGaN/GaN superlattice cladding layer 23 in lieu of the undoped AlGaN cladding layer 9 used in the GaN compound semiconductor laser according to the first embodiment. The undoped AlGaN/GaN superlattice cladding layer 23 includes 2.5 nm thick undoped AlGaN layers as barrier layers and 2.5 nm thick GaN layers as well layers, for example, which are alternately stacked. The average Al composition ratio of this cladding layer 23 is 0.025~0.10, for example, and its entire thickness is 100~500 nm, for example. In the other respects, configuration of the GaN compound semiconductor laser according to the first embodiment is the same as that of the first embodiment. So its explanation is omitted.

According to the second embodiment, since the undoped layer among p-side cladding layers is the undoped AlGaN/GaN superlattice cladding layer 23, holes injected from the part of the p-side electrode 20 and having reached the undoped AlGaN/GaN superlattice cladding layer 23 easily pass through the undoped AlGaN/GaN superlattice cladding layer 23 by the tunneling effect and are injected to the active layer 7. Therefore, injection of holes into the active layer 7 is easier, and the operation voltage of the GaN compound semiconductor laser is still further reduced. In addition, hetero interfaces existing in the undoped AlGaN/GaN superlattice cladding layer 23 effectively prevent diffusion of Mg from the p-type layers into the active layer 7, and effectively prevents deterioration of the active layer 7. Other advantages of the second embodiment are common to those of the first embodiment.

Next explained is a GaN compound semiconductor laser according to the third embodiment of the invention.

The GaN semiconductor compound semiconductor laser according to the third embodiment basically has the same structure as the GaN compound semiconductor laser according to the first embodiment. However, the undoped InGaN optical waveguide layer 8 and the p-type AlGaN/GaN super lattice cladding layer 12 are different in thickness from those in the GaN compound semiconductor laser according to the first embodiment. More specifically, in the GaN compound semiconductor according to the first embodiment, the undoped InGaN optical waveguide layer 8 is 30 nm thick and the p-type AlGaN/GaN superlattice cladding layer 12 is 400 nm thick, for example. In the GaN compound semiconductor laser according to the third embodiment, the undoped InGaN optical waveguide layer 8 is 24.5 nm thick and the p-type AlGaN/GaN superlattice cladding layer 12 is 500 nm thick, for example. In the other respects, the GaN compound semiconductor laser taken here is common to the GaN compound semiconductor laser according to the first embodiment. So its explanation is omitted.

Figure 9:
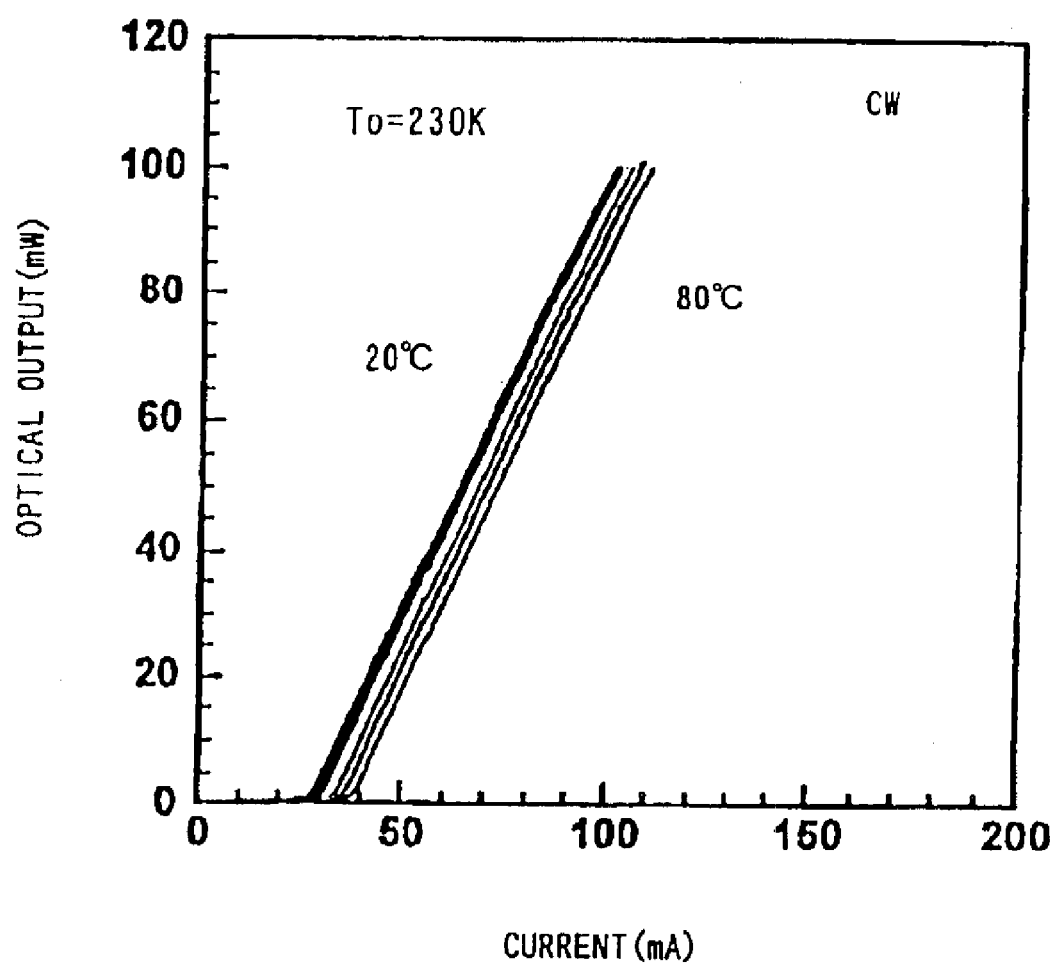
FIG. 9 is a schematic diagram showing the optical output-to-current property of a GaN compound semiconductor laser according to the third embodiment of the invention.

Changes of the optical output to current property of this GaN compound semiconductor laser were measured by changing the environmental temperature by 10° C. from 20° C. to 80° C. A result of the measurement is shown in FIG. 9. It is appreciated from FIG. 9 that the characteristic temperature $T_0$ of this GaN compound semiconductor laser is 230 K. By comparison of FIG. 9 with FIG. 7, gradient of the optical output to current property, i.e. sloping efficiency, of this GaN compound semiconductor laser is considerably larger than that of the existing GaN compound semiconductor laser.

Figure 10:
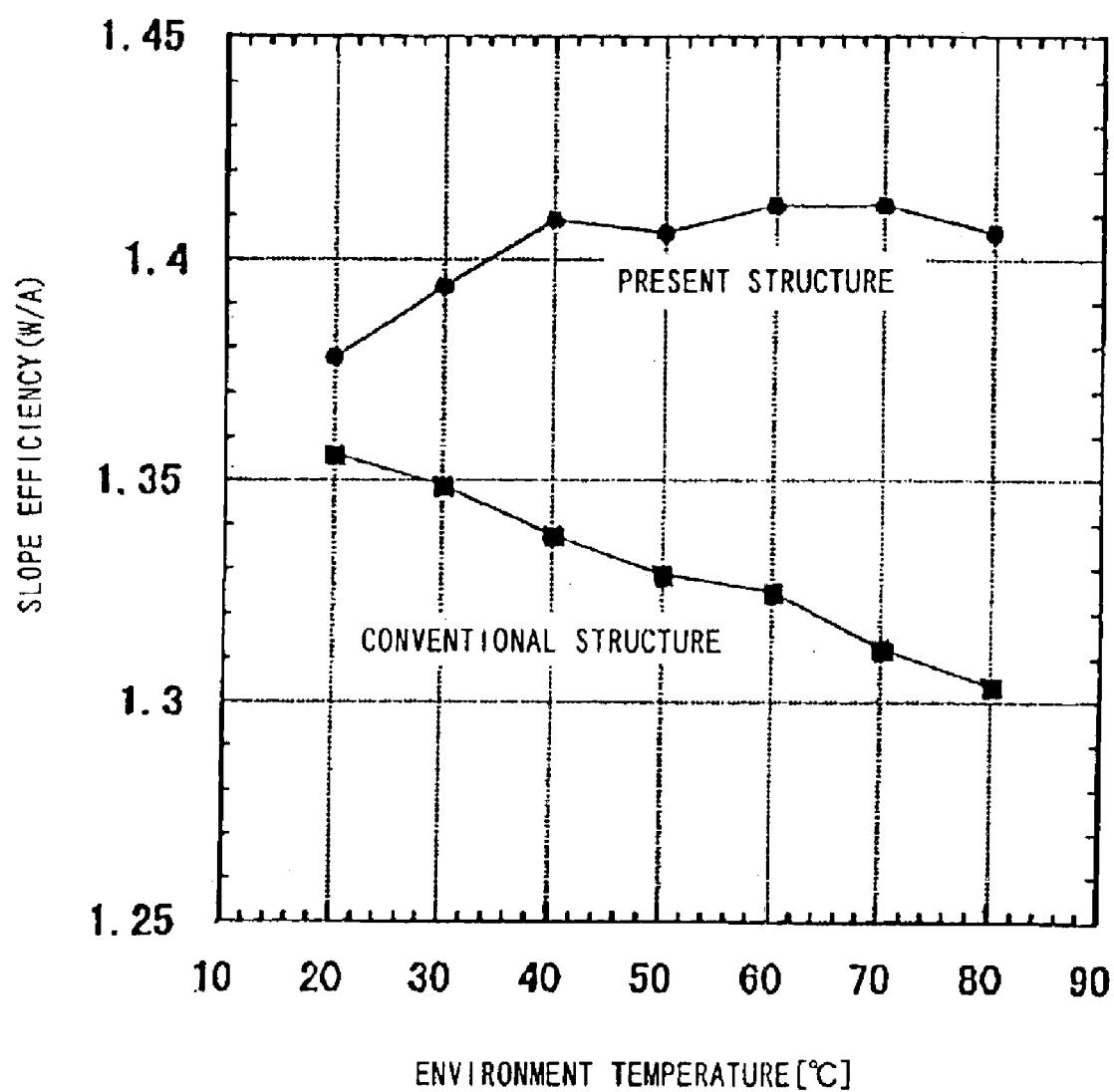
FIG. 10 is a schematic diagram showing changes of the slope efficiency of the GaN compound semiconductor laser according to the third embodiment with ambient temperature.

FIG. 10 shows measured changes of the slope efficiency of this GaN compound semiconductor laser by the environmental temperature. For comparison purposes, FIG. 10 also shows a result of similar measurement with the existing GaN compound semiconductor laser. It is appreciated from FIG. 10 that, while the slope efficiency of the existing GaN compound semiconductor laser continuously decreases as the environmental temperature rises, the slope efficiency of the GaN compound semiconductor laser according to the third embodiment increase as the environmental temperature rises from room temperatures approximately to 40° C. and remain constant above that temperature. This relies on the reason already explained. That is, in the existing GaN compound semiconductor laser, the electron blocking effect by the p-type AlGaN electron blocking layer was difficult to ascertain because of a large quantity of the leak current to opposite sides of the ridge; however, in the GaN compound semiconductor laser according to the third embodiment, because of remarkable reduction of the leak current to opposite sides of the ridge 14, the electron blocking effect by the p-type AlGaN electron blocking layer 11 is high, and overflow of electrons is effectively prevented even during high-temperature, high-output driving.

This third embodiment has the same advantages as those of the first embodiment.

Figure 11:
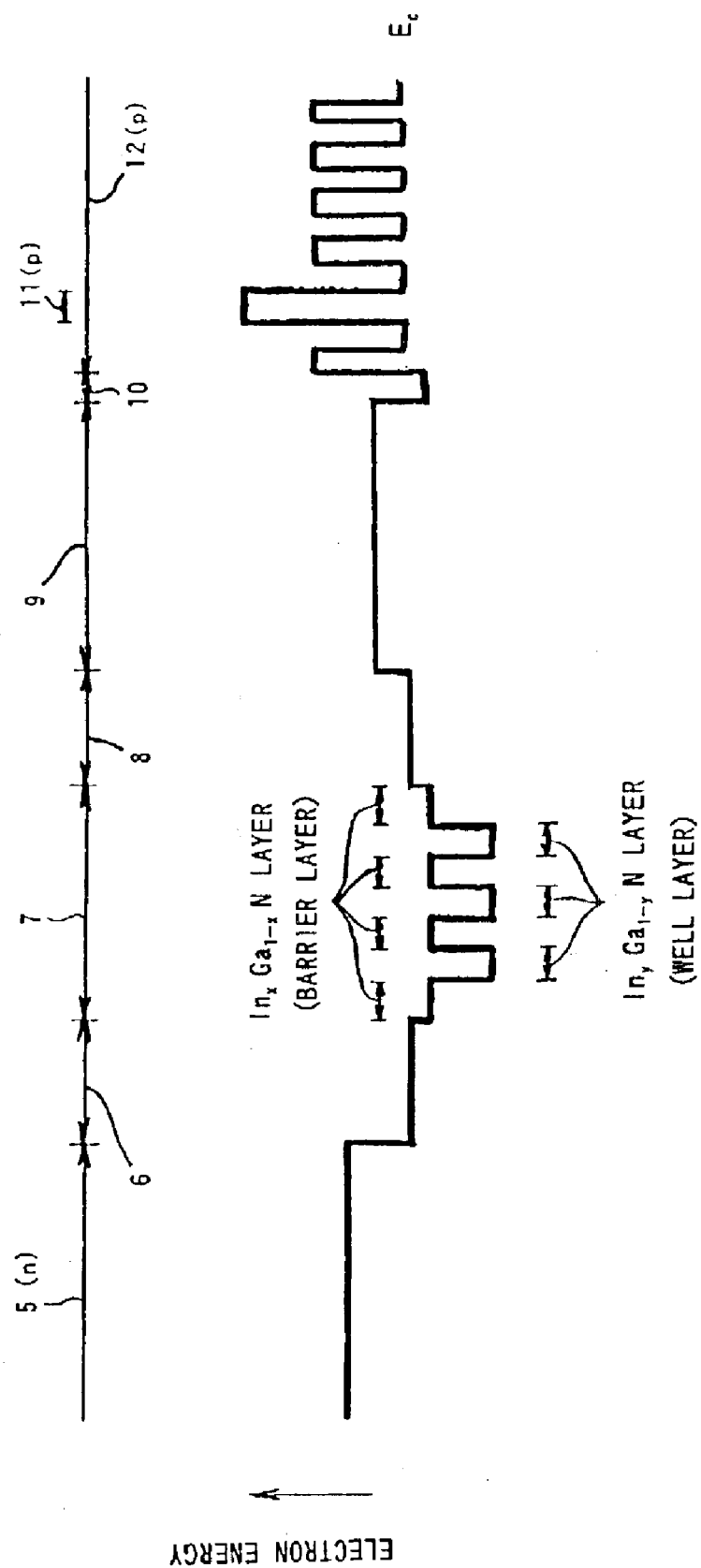
FIG. 11 is a schematic diagram showing the energy band structure of a GaN compound semiconductor laser according to the fourth embodiment of the invention.

Next explained is a GaN compound semiconductor laser according to the fourth embodiment of the invention. FIG. 11 shows the energy band structure, especially its conduction band, of this GaN compound semiconductor laser.

As shown in FIG. 11, in the GaN semiconductor compound semiconductor laser according to the fourth embodiment, the p-type AlGaN electron blocking layer 11 is positioned in the p-type AlGaN/GaN superlattice cladding layer 12. Although the GaN compound semiconductor laser according to the first embodiment is configured to interpose the p-type AlGaN electron blocking layer 11 between the undoped InGaN layer 10 and the p-type AlGaN/GaN superlattice cladding layer 12, but the GaN compound semiconductor laser according to the fourth embodiment locates the p-type AlGaN electron blocking layer 11 inside the p-type AlGaN/GaN superlattice cladding layer 12 apart from the undoped InGaN layer 10. Thickness of the p-type AlGaN/GaN superlattice cladding layer 12 between the undoped AlGaN cladding layer 9 and the p-type AlGaN electron blocking layer 11 may be around 10~50 nm, for example. The other configuration of this GaN compound semiconductor laser is common to that of the first embodiment.

The same method as that of the first embodiment is used for manufacturing the GaN compound semiconductor laser according to this embodiment. Its explanation is omitted here.

This fourth embodiment also has the same advantages as those of the first embodiment.

Next explained is a GaN compound semiconductor laser according to the fifth embodiment of the invention.

The GaN semiconductor compound semiconductor laser according to the fifth embodiment basically has the same structure as the GaN compound semiconductor laser according to the first embodiment; however, it is characterized in that the distance D (see FIG. 3) between one end surface of the well layer of the active layer 7 nearest to the undoped InGaN optical waveguide layer 8 and one end surface of the p-type AlGaN electron blocking layer nearer to the active layer 7, which is the Mg-doping start position, is 65~230 nm and that Al composition ratio z of the undoped AlGaN cladding layer 9 is $0 < z \leq 0.04$. The other features of this GaN compound semiconductor laser are common to those of the fist embodiment.

Here again, the same method as that of the first embodiment is used for manufacturing the GaN compound semiconductor laser according to this embodiment. Its explanation is omitted here.

Figure 12:
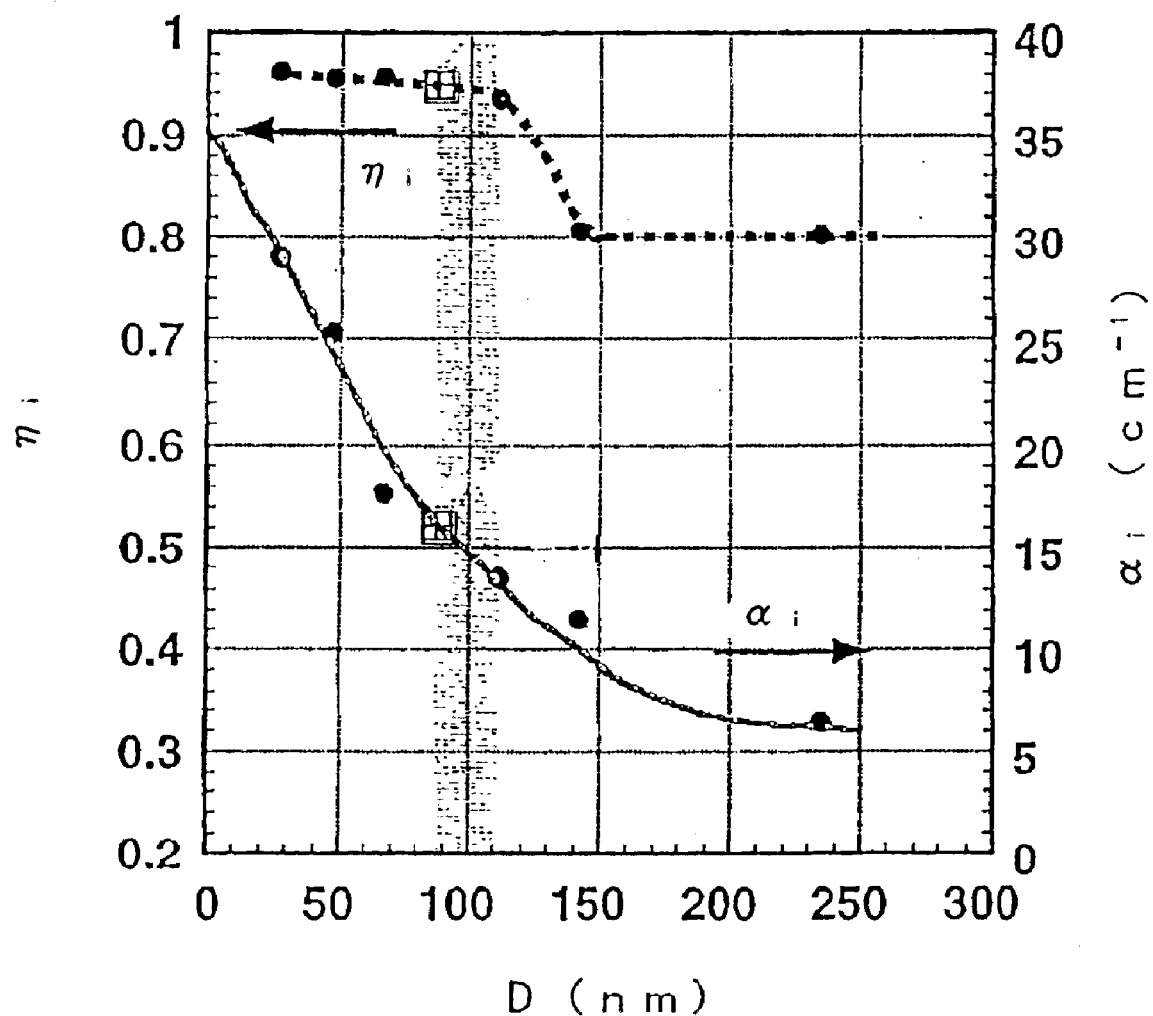
FIG. 12 is a schematic diagram showing changes of the internal loss and the internal quantum efficiency of a GaN compound semiconductor laser according to the fifth embodiment with Mg doping start position.

FIG. 12 shows a result of measurement to examine how the internal quantum efficiency $\eta_1$ and the internal loss $\alpha_1$ of this GaN compound semiconductor layer change with D, which is the MG-doping start position. As shown in FIG. 12, as D increases, that is, as the Mg-doping start position becomes far away from the active layer 7, $\alpha_1$ goes on decreasing, but $\eta_1$ largely decreases stepwise. When designing lasers, it is desirable to decrease $\alpha_1$ while maintaining $\eta_1$ at a high value.

In FIG. 12, $\alpha_1$ is substantially constant in the region of D>230 nm regardless of D. There is no point in further increase of D for decreasing $\alpha_1$, and it only increases the time required for epitaxial growth and decreases the productivity. Therefore, D is preferably limited within 230 nm. On the other hand, although $\eta_1$ is around 0.96 regardless of D, it slightly decreases when D increases, then rapidly decreases after D exceeds approximately 110 nm until reaching 140 nm, and keeps 0.8 in the region of D>140 nm. In the region where $\eta_1$ does not decrease, D had better be largest from the viewpoint of reducing $\alpha_1$. Therefore, D is preferably not smaller than 65 nm.

From the foregoing review, D is preferably in the range from 65 nm to 230 nm. In this range of D, $\eta_1$ is 0.8 or more, and $\alpha_1$ is 20 cm$^{-1}$ or less. These are sufficiently practical levels. When D is in the range of 70 to 125 nm, $\eta_1$ is 0.9 or more, and $\alpha_1$ is 19 cm$^{-1}$ or less. These values are more preferable. When D is in the range of 90 to 110 nm, $\eta_1$ is 0.95 or more, and $\alpha_1$ is 15 cm$^{-1}$ or less. These values are still more preferable.

Figure 13:
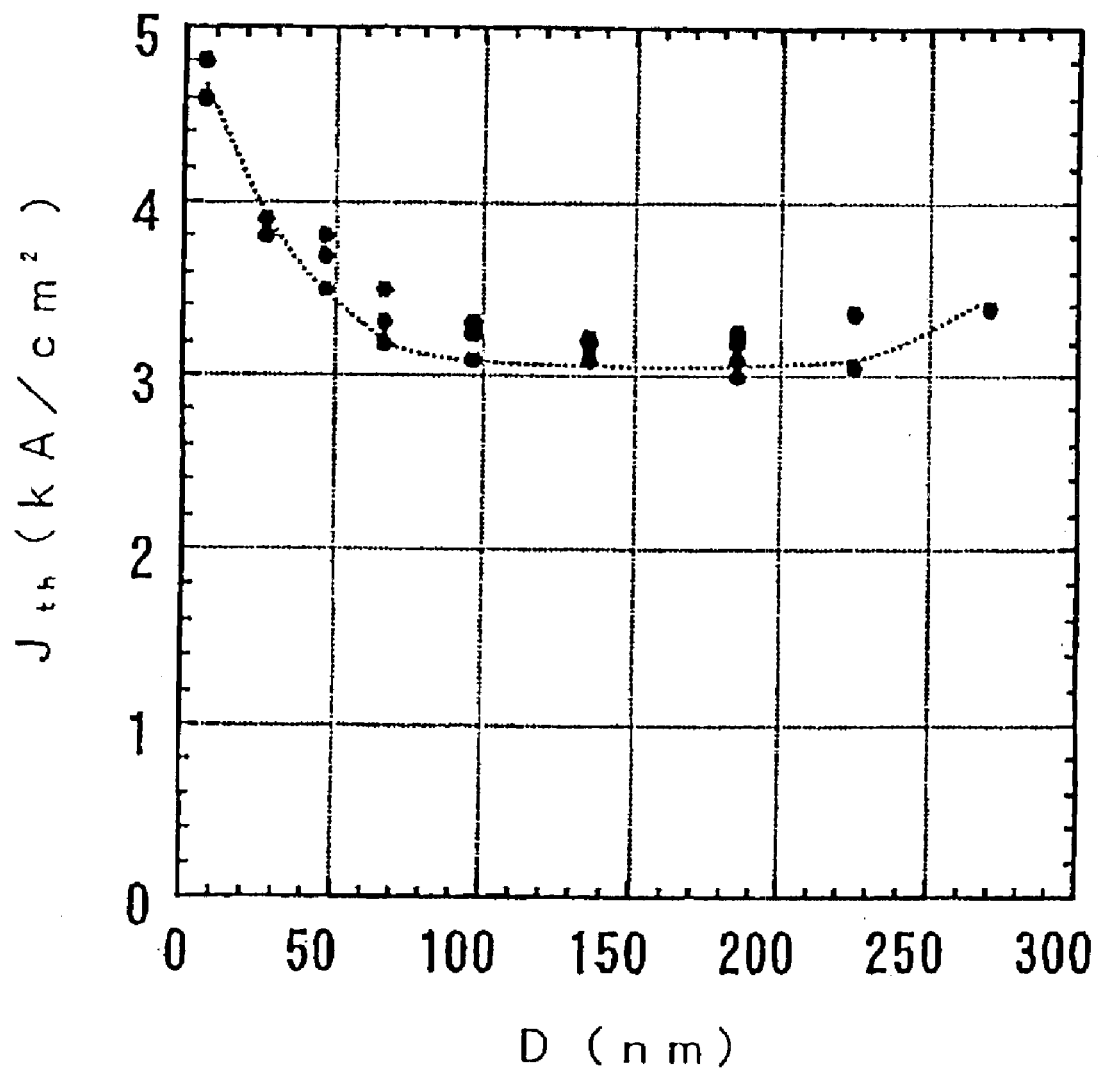
FIG. 13 is a schematic diagram showing changes of the threshold current density of the GaN compound semiconductor laser according to the fifth embodiment with Mg doping start position.

FIG. 13 shows a result of measurement conducted to examine how the threshold current density $J_{th}$ of the GaN compound semiconductor laser according to the fifth embodiment changes with D, which is the Mg-doping start position. As shown in FIG. 13, in the region of D from 65 to 230 nm, the threshold current density $J_{th}$ is lowest. It is appreciated therefore that optimum values of D fall in the range from 65 to 230 nm also from the viewpoint of the threshold current density $J_{th}$.

Figure 14A:
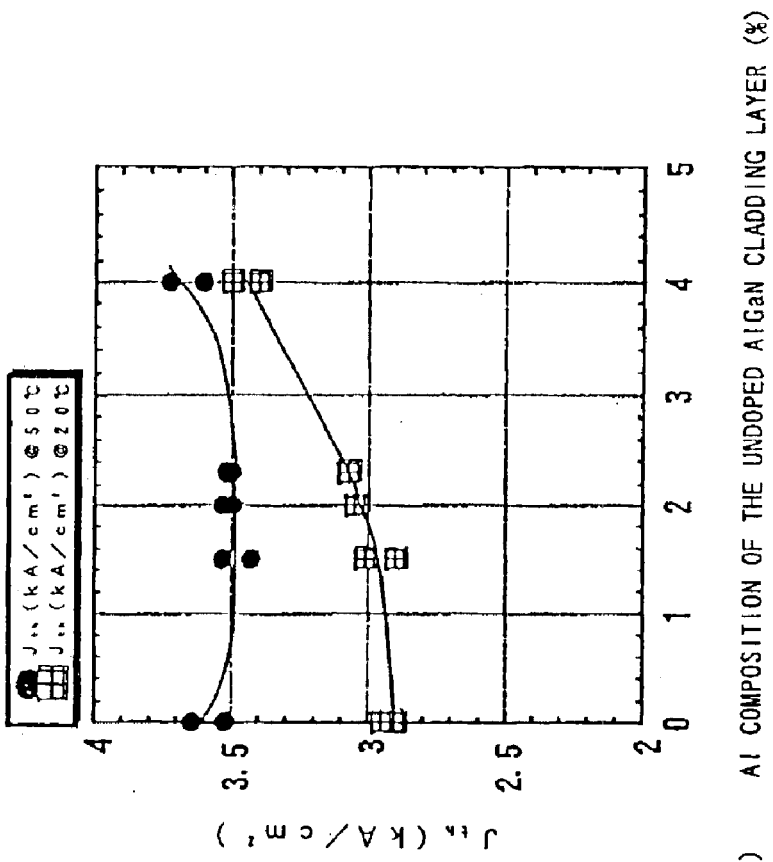
FIGS. 14A and 14B are schematic diagrams showing changes of the characteristic temperature and the threshold current density of the GaN compound semiconductor laser according to the fifth embodiment with Al composition of the undoped AlGaN cladding layer.
Figure 14B:
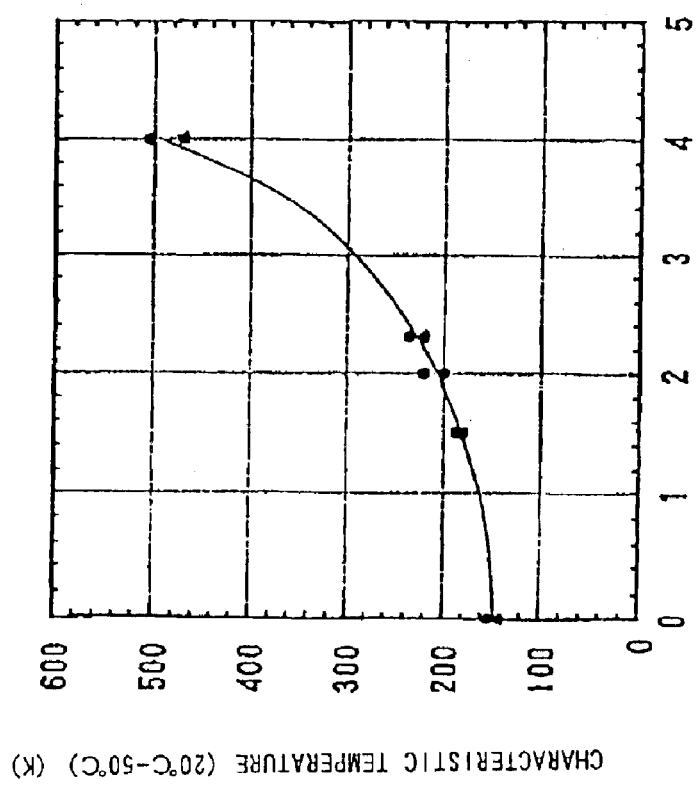
Figure 15:
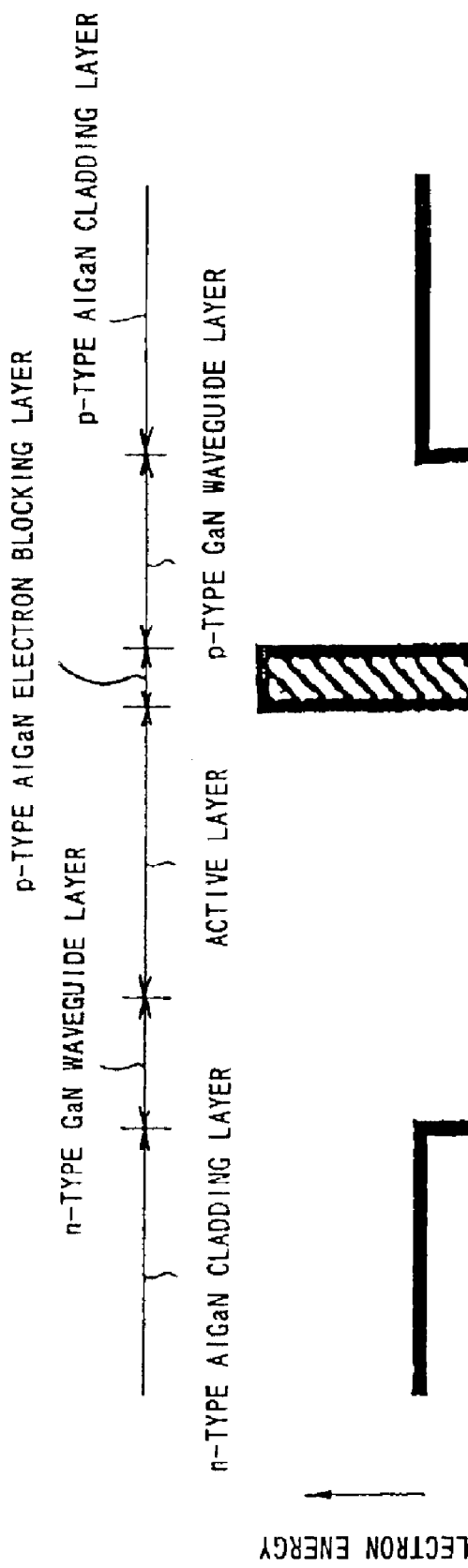
FIG. 15 is a schematic diagram showing the energy band structure of a typical conventional GaN compound semiconductor laser.

FIGS. 14A and 14B show changes of the characteristic temperature $T_0$ (FIG. 14A) and the threshold current density $J_{th}$ (FIG. 14B) of the GaN compound semiconductor laser according to the fifth embodiment when changing the Al composition of the undoped AlGaN cladding layer 9 while fixing D in 136.5 nm and the thickness of the undoped AlGaN cladding layer 9 in 100 nm. It is appreciated from FIGS. 14A and 14B that $T_0$ rises as the Al composition of he undoped AlGaN cladding layer 9 increases but the threshold current density $J_{th}$ at 20° C. also increases ($J_{th}$@20° C.). This phenomenon is assumed to occur because the increase of the Al composition of the undoped AlGaN cladding layer 9 degrades the injection efficiency of holes into the active layer 7. Enhancement of the temperature characteristic is advantageous for controlling the increase of the threshold current during high-temperature driving. However, the increase of the threshold current degrades the efficiency of improving the temperature characteristics during low-temperature driving. It can be known from the threshold current density $J_{th}$ ($J_{th}$@50° C.) that the Al composition is desirable to be not larger than 4%.

As reviewed above, in addition to the same advantages as those of the first embodiment, the fifth embodiment can realize a GaN compound semiconductor laser more excellent in laser property, which is capable of keeping the internal quantum efficiency $\eta_1$ sufficiently high, the internal loss $\alpha_1$ sufficiently low, the characteristic temperature $T_0$ high and the threshold current density low.

Heretofore, specific embodiments of the invention have been explained. However, the invention is not limited to these embodiments but contemplates various changes and modifications based on the technical concept of the invention.

For example, numerical values, structures, configurations, substrates, source materials, processes, and so on, are not but mere examples, and other numerical values, structures, configurations, substrates, source materials, processes, etc. may be acceptable.

For example, although the first to fifth embodiments have been explained as first depositing n-type layers of the laser structure on the substrate and thereafter depositing p-type layers thereon, the order of deposition may be contrary to first deposit p-type layers on the substrate and then deposit n-type layers.

Further, the undoped InGaN optical waveguide layer 6 as the n-side optical waveguide layer and the undoped InGaN optical waveguide layer 8 as the p-side optical waveguide layer are equal in composition in the first to fifth embodiments. However, the undoped InGaN optical waveguide layer 6 and the undoped InGaN optical waveguide layer 8 may be different in composition provided favorable optical properties are ensured. For example, the In composition of the undoped InGaN optical waveguide layer 8 may be lower than that of the undoped InGaN optical waveguide layer 6. It is also acceptable to use a material such as GaN different from the InGaN as the n-side optical waveguide layer and the p-side optical waveguide layer if it is appropriate.

The c-plane sapphire substrate used in any of the first to fifth embodiments may be replaced by SiC substrate, Si substrate, spinel substrate, substrate made of a thick n-type GaN layer, or the like, if it is desirable. The GaN buffer layer may be replaced by an AlN buffer layer or AlGaN buffer layer as well.

The first to fifth embodiments have been explained as applying the present invention to SCH-structured GaN compound semiconductor lasers. However, the invention is also applicable of course to DH (double heterostructure) structured GaN compound semiconductor lasers and even to GaN compound light emitting diodes.

The AlGaN layer of the p-type AlGaN/GaN superlattice cladding layer, which is not doped with Mg in the first to fifth embodiment, may be also doped with Mg. Alternatively, Mg may be doped into the AlGaN layer without doping Mg into the GaN layer.

Further, if appropriate, the p-side cladding layer may be made of an undoped or n-type first layer and a p-type second layer, and at the same time, the n-side cladding layer may be made of an undoped or p-type first layer and an n-type second layer.

As described above, according to the invention, since the p-side cladding layer is made of the undoped or n-type first layer and the p-type second layer doped with a p-type impurity, which are stacked sequentially from nearer to remoter from the active layer, it is possible to reduce the thickness of the p-type layers having high specific resistance values and causing an increase of the operation voltage as thin as possible and thereby reduce the operation voltage of the semiconductor light emitting device while keeping a thickness of the p-side cladding layer necessary for ensuring a favorable light field and a favorable optical property. Since a sufficient distance can be provided between the active layer and the second layer, diffusion of the p-type impurity of the second layer into the active layer and deterioration of the active layer thereby can be prevented. Furthermore, especially when the second layer includes the p-type third layer having a larger band gap than the second layer, the third layer can prevent over flow of electrons injected to the active layer.

Furthermore, since the thickness of p-type layers in opposite sides of the ridge is limited within 0 to 100 nm, or the bottoms of the portion in opposite sides of the ridge are deeper than the boundary between the first layer and the second layer, the current injected during operation of the semiconductor light emitting device can be effectively prevented from leakage outside the ridge, and it contributes to attaining a much higher characteristic temperature than existing ones and realizing remarkably excellent temperature characteristics.

Furthermore, since growth of particular layers containing In is carried out in the carrier gas atmosphere containing substantially no hydrogen and containing nitrogen as its major component, separation of In from layers containing In, such as the active layer, can be prevented effectively, and deterioration of the active layer can be prevented, thereby improving reliability and lifetime of semiconductor light emitting devices.

Furthermore, since the distance between the active layer and the nearest p-type layer doped with the p-type impurity is at least 50 nm, diffusion of the p-type impurity from the p-type layer to the active layer can be reduced significantly, and deterioration of the active layer can be prevented, thereby improving reliability and lifetime of semiconductor light emitting devices.

Furthermore, since the n-side cladding layer is made of the undoped or p-type first layer and the n-type second layer doped with an n-type impurity, which are stacked sequentially from nearer to remoter from the active layer, it is possible to minimize the thickness of n-type layers with high specific resistance values causing an increase of the operation voltage and thereby reduce the operation voltage while keeping the n-side cladding layer thick enough to obtain a good light field for the semiconductor light emitting device and thereby obtain favorable optical properties. Additionally, since a sufficient distance can be provided between the active layer and the second layer, diffusion of the n-type impurity of the second layer into the active layer and deterioration of the active layer thereby can be prevented.

Furthermore, since the thickness of n-type layers in opposite sides of the ridge is limited within 0 to 100 nm, or the bottoms of the portion in opposite sides of the ridge are deeper than the boundary between the first layer and the second layer, leakage of the current injected during operation of the semiconductor light emitting device outside the ridge can be prevented effectively, and a much higher characteristic temperature than existing ones can be attained and remarkably excellent temperature characteristics can be realized.

What is claimed is:

1. A semiconductor light emitting device with nitride III-V compound semiconductors, the device comprising
    an active layer interposed between an n-side cladding layer and a p-side cladding layer,
    wherein,
    the p-side cladding layer includes an undoped or n-type first layer and a p-type second layer doped with a p-type impurity which lie in this order from one side nearer the active layer, and
    the second layer includes a third layer having a larger band gap than the second layer, and
    the p-side cladding layer has a superlattice structure.

2. A semiconductor light emitting device with nitride III-V compound semiconductors, the device comprising
    an active layer interposed between an n-side cladding layer and a p-side cladding layer,
    the p-side cladding layer includes an undoped or n-type first layer and a p-type second layer doped with a p-type impurity which lie in this order from one side nearer the active layer,
    the second layer includes a third layer having a larger band gap than the second layer, and
    the third layer is made of a p-type nitride III-V compound semiconductor containing Al and Ga.

3. A semiconductor light emitting device with nitride III-V compound semiconductors, the device comprising
    an active layer interposed between an n-side cladding layer and a p-side cladding layer,
    wherein,
    the p-side cladding layer includes an undoped or n-type first layer and a p-type second layer doped with a n-type impurity which lie in this order from one side nearer the active layer,
    the second layer includes a third layer having a larger band gap than the second layer, and the third layer is made of p-type $Al_xGa_{1-x}N$ (where $0<x<1$).

4. A semiconductor light emitting device with nitride III-V compound semiconductors, the device comprising
an active layer interposed between an n-side cladding layer and a p-side cladding layer,
wherein,
the p-side cladding layer includes an undoped or n-type first layer and a p-type second layer doped with a p-type impurity which lie in this order from one side nearer the active layer,
the second layer includes a third layer having a larger band gap than the second layer, and
the third layer is made of p-type $Al_xGa_{1-x}N$ (where $0.15 \leq x1$).

5. A semiconductor light emitting device with nitride III-V compound semiconductors, the device comprising
an active layer interposed between an n-side cladding layer and a p-side cladding layer,
the p-side cladding layer includes an undoped or n-type first layer and a p-type second layer doped with a p-type impurity which lie in this order from one side nearer the active layer,
the second layer includes a third layer having a larger band gap than the second layer, and
the first layer of the p-side cladding layer is made of p-type $Al_yGa_{1-y}N$ (where $0<y \leq 0.04$).

6. A semiconductor light emitting device made by using nitride III-V compound semiconductors, and having a structure interposing an active layer between an n-side cladding layer and a p-side cladding layer and a ridge structure, comprising:
the p-side cladding layer including an undoped or n-type first layer and a p-type second layer doped with a p-type impurity in this order from one side nearer to the active layer, and the second layer including a third layer having a larger band gap than the second layer; and
bottom surfaces of portions in opposite sides of the ridge being deeper than the boundary between the first layer and the second layer.

7. The semiconductor light emitting device according to claim 6 wherein the bottom surfaces of portions in opposite sides of the ridge are positioned in the first layer.

8. A semiconductor light emitting device made by using nitride III-V compound semiconductors, which has a structure interposing an active layer between an n-side cladding layer and a p-side cladding layer and has a ridge structure, comprising:
the p-side cladding layer including an undoped or n-type first layer and a p-type second layer doped with a p-type impurity in this order from one side nearer to the active layer; and
p-type layers in opposite sides of the ridge having a thickness in the range from 0 to 100 nm.

9. The semiconductor light emitting device according to claim 8 wherein p-type layers in opposite sides of the ridge have a thickness in the range from 0 to 50 nm.

10. A semiconductor light emitting device made by using nitride III-V compound semiconductors, which has a structure interposing an active layer between an n.side cladding layer and a p-side cladding layer and has a ridge structure, comprising:

the p-side cladding layer including an undoped or n-type first layer and a p-type second layer doped with a p-type impurity in this order from one side nearer to the active layer; and
bottom surfaces of portions in opposite sides of the ridge being deeper than the boundary between the first layer and the second layer.

11. The semiconductor light emitting device according to claim 10 wherein the bottom surfaces of portions in opposite sides of the ridge are positioned in the first layer.

12. A semiconductor light emitting device having a structure interposing an active layer between an n-side cladding layer and a p-side cladding layer and having a ridge structure, comprising:
the p-side cladding layer including an undoped or n-type first layer and a p-type second layer doped with a p-type impurity in this order from one side nearer to the active layer; and
p-type layers in opposite sides of the ridge having a thickness in the range from 0 to 100 nm.

13. The semiconductor light emitting device according to claim 12 wherein p-type layers in opposite sides of the ridge have a thickness in the range from 0 to 50 nm.

14. A semiconductor light emitting device having a structure interposing an active layer between an n-side cladding layer and a p-side cladding layer and having a ridge structure, comprising:
the p-side cladding layer including an undoped or n-type first layer and a p-type second layer doped with a p-type impurity in this order from one side nearer to the active layer; and
bottom surfaces of portions in opposite sides of the ridge being deeper than the boundary between the first layer and the second layer.

15. The semiconductor light emitting device according to claim 14 wherein the bottom surfaces of portions in opposite sides of the ridge are positioned in the first layer.

16. A semiconductor light emitting device having a structure interposing an active layer between an n-side cladding layer and a p-side cladding layer, and having a ridge structure, comprising:
the n-side cladding layer including an undoped or p-type first layer and an n-type second layer doped with an n-type impurity in this order from one side nearer to the active layer; and
n-type layers in opposite sides of the ridge having a thickness in the range from 0 to 100 nm.

17. A semiconductor light emitting device having a structure interposing an active layer between an n-side cladding layer and a p-side cladding layer, and having a ridge structure, comprising:
the n-side cladding layer including an undoped or p-type first layer and an n-type second layer doped with an n-type impurity in this order from one side nearer to the active layer; and
bottom surfaces of portions in opposite sides of the ridge being deeper than the boundary between the first layer and the second layer.

\* \* \* \* \*